US009627076B2

(12) United States Patent
Nam

(10) Patent No.: US 9,627,076 B2
(45) Date of Patent: Apr. 18, 2017

(54) NONVOLATILE MEMORY DEVICE AND ERASING METHOD THEREOF

(71) Applicant: Sang-Wan Nam, Hwaseong-si (KR)

(72) Inventor: Sang-Wan Nam, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 4 days.

(21) Appl. No.: 14/574,079

(22) Filed: Dec. 17, 2014

(65) Prior Publication Data

US 2015/0325301 A1   Nov. 12, 2015

(30) Foreign Application Priority Data

May 12, 2014   (KR) ......................... 10-2014-0056639

(51) Int. Cl.
    *G11C 16/14*   (2006.01)
    *G11C 16/16*   (2006.01)
    *G11C 16/04*   (2006.01)

(52) U.S. Cl.
    CPC .......... *G11C 16/16* (2013.01); *G11C 16/0483* (2013.01); *G11C 16/14* (2013.01)

(58) Field of Classification Search
    CPC .................................................... G11C 16/14
    USPC ........................................ 365/185.11, 17, 22
    See application file for complete search history.

(56) References Cited

U.S. PATENT DOCUMENTS

| 7,313,009 | B2 | 12/2007 | Futatsuyama |
| 7,315,472 | B2 | 1/2008 | Lee |
| 7,804,718 | B2 | 9/2010 | Kim |
| 8,094,503 | B2 | 1/2012 | Shields et al. |
| 8,116,143 | B2 | 2/2012 | Yip |
| 8,288,816 | B2 * | 10/2012 | Komori ................. H01L 29/792 257/324 |
| 8,355,281 | B2 * | 1/2013 | Grossi ................ H01L 27/0688 257/324 |
| 8,537,615 | B2 | 9/2013 | Maeda |
| 8,559,224 | B2 | 10/2013 | Han et al. |
| 2007/0047633 | A1 | 3/2007 | Tung et al. |
| 2007/0121385 | A1 | 5/2007 | Futatsuyama |

(Continued)

FOREIGN PATENT DOCUMENTS

| JP | 2013200913 A | 10/2013 |
| KR | 20130035553 A | 4/2013 |

*Primary Examiner* — Anthan Tran
*Assistant Examiner* — Mushfique Siddique
(74) *Attorney, Agent, or Firm* — Harness, Dickey & Pierce, P.L.C.

(57) ABSTRACT

According to example embodiments, a nonvolatile memory device includes a lower filling insulating layer covering a peripheral logic structure on a substrate, a horizontal semiconductor layer on the lower filling insulating layer, and a three-dimensional memory cell array including a plurality of memory blocks on the horizontal semiconductor layer. The horizontal semiconductor layer includes a plurality of doped regions spaced apart from each other in a first direction and a plurality of well regions between the doped regions. Each of the memory blocks includes sub-blocks on corresponding ones of the well regions. The non-volatile memory device is configured to perform an erase operation in units of the sub-blocks. The non-volatile memory device is configured to independently apply an erase voltage to a selected one of the well regions during the erase operation.

20 Claims, 23 Drawing Sheets

(56) References Cited

U.S. PATENT DOCUMENTS

| | | |
|---|---|---|
| 2007/0140008 A1 | 6/2007 | Shields et al. |
| 2008/0219053 A1 | 9/2008 | Kim |
| 2010/0302857 A1 | 12/2010 | Shields et al. |
| 2011/0158003 A1 | 6/2011 | Yip |
| 2011/0199825 A1 | 8/2011 | Han et al. |
| 2012/0051143 A1* | 3/2012 | Yoon ................ G11C 16/0483 365/185.22 |
| 2012/0134210 A1 | 5/2012 | Maeda |
| 2012/0170365 A1 | 7/2012 | Kang et al. |
| 2013/0016561 A1* | 1/2013 | Nam ................ H01L 27/11556 365/185.11 |
| 2013/0083599 A1* | 4/2013 | Nam ................ G11C 16/14 365/185.11 |
| 2013/0107628 A1* | 5/2013 | Dong ................ G11C 16/0483 365/185.17 |
| 2013/0127011 A1* | 5/2013 | Higashitani ....... H01L 27/11575 257/532 |
| 2014/0043916 A1* | 2/2014 | Costa ................ G11C 16/14 365/185.25 |
| 2015/0145015 A1* | 5/2015 | Shin ................ H01L 27/11556 257/314 |
| 2016/0099047 A1* | 4/2016 | Lee ................ G11C 7/1039 365/185.03 |

* cited by examiner

FIG. 9

| | Control Voltage | |
|---|---|---|
| | Selected Block | Unselected Block |
| SSL | Float | Float |
| WL | VSS(0V) | Float(10V) |
| GSL | Vss→Float | Vss→Float |
| Selected PPW (Selected Sub-block) | Vers(20V) | Vers(20V) |
| Unselected PPW (Unselected Sub-block) | VSS(0V) | VSS(0V) |

FIG. 10

| | Control Voltage | |
|---|---|---|
| | Selected Block | Unselected Block |
| SSL | Float | Float |
| WL | VSS(0V) | Float(13V) |
| GSL | Vss→Float | Vss→Float |
| Selected PPW (Selected Sub-block) | Vers(20V) | Vers(20V) |
| Unselected PPW (Unselected Sub-block) | Vuners(6V) or Float | Vuners(6V) or Float |

NONVOLATILE MEMORY DEVICE AND ERASING METHOD THEREOF

CROSS-REFERENCE TO RELATED APPLICATIONS

This US non-provisional patent application claims priority under 35 USC §119 to Korean Patent Application No. 10-2014-0056639, filed on May 12, 2014, the entirety of which is hereby incorporated by reference.

BACKGROUND

The present disclosure relates to semiconductor memory devices and, more particularly, to nonvolatile memory devices and/or erasing methods thereof.

Semiconductor memory device are memory devices implemented using a semiconductor such as silicon (Si), germanium (Ge), gallium arsenide (GaAs), and indium phosphide (InP). In general, semiconductor memory devices may be classified as volatile memory devices and nonvolatile memory devices.

Volatile memory devices lose their stored data when their power supplies are interrupted. Volatile memory devices may include a static RAM (SRAM), a dynamic RAM (DRAM), and a synchronous DRAM (SDRAM). Nonvolatile memory devices are memory devices that retain their stored data even when their power supplies are interrupted. Nonvolatile memory devices may include a read only memory (ROM), a programmable ROM (PROM), an electrically programmable ROM (EPROM), an electrically erasable and programmable ROM (EEPROM), a flash memory device, a phase change RAM (PRAM), a magnetic RAM (MRAM), a resistive RAM (RRAM), and a ferroelectric RAM (FRAM). Flash memory devices are classified as NOR-type flash memory devices and NAND-type flash memory devices.

In recent years, semiconductor memory devices having a three-dimensional array structure have been researched to improve the integration density of semiconductor memory devices. A semiconductor memory device having a three-dimensional structure is tending to increase in stacked height. The more the stacked height increases, the greater the number of memory cells may be included in a single memory block. Accordingly, in the case of a semiconductor memory device that performs an erase operation in units of memory blocks, the number of memory cells included in an erase unit may increase. Thus, the number of memory blocks in the semiconductor may decrease. If the number of the memory blocks decreases, there may be a limitation in the number of blocks that can be replaced when a failure or a progressive failure caused by a process occurs. As a result, productivity of the semiconductor memory device may be reduced.

SUMMARY

Example embodiments relate to a nonvolatile memory device.

According to example embodiments, a nonvolatile memory device may include a substrate; a peripheral logic structure on the substrate; a lower filling insulating layer covering the peripheral logic structure; a horizontal semiconductor layer on the lower filling insulating layer, the horizontal semiconductor layer including a plurality of doped regions spaced apart from each other in a first direction and a plurality of well regions between the doped regions; and a three-dimensional memory cell array on the horizontal semiconductor layer. The three-dimensional array includes a plurality of memory blocks. Each of the memory blocks includes sub-blocks on corresponding ones of the well regions. The nonvolatile memory device is configured to perform an erase operation in units of the sub-blocks by independently applying an erase voltage to a selected one of the well regions during the erase operation.

In example embodiments, the three-dimensional memory cell array may include a plurality of cell strings. Each of the cell strings may include a plurality of memory cells stacked on each other in a direction perpendicular to the horizontal semiconductor layer, a ground select transistor between the memory cells and the horizontal semiconductor layer, and a string select transistor between the memory cells and a bitline.

In example embodiments, the doped regions may extend in a direction perpendicular to the three-dimensional memory cell array, and the doped regions may be connected to the lower filling insulating layer.

In example embodiments, the well regions may include a first well region. The first well region may be the selected one of the well regions during the erase operation. The first well region may correspond to a selected sub-block among the sub-blocks during the erase operation.

In example embodiments, the well regions may include a second well region, the second well region may be an unselected one of the well regions during the erase operation, the second well region may be an unselected sub-block among the sub-blocks during the erase operation, and the non-volatile memory device may be configured to apply an unselect voltage to the second well region or float the second well region during the erase operation.

In example embodiments, the non-volatile memory device may be configured to supply a voltage during the erase operation to wordlines that are connected to a selected one of memory blocks, and the unselect erase voltage may be higher than the voltage supplied to wordlines connected to the selected one of the memory blocks during the erase operation.

In example embodiments, the doped regions may be a common source line.

In example embodiments, the first direction may be a direction parallel to bitlines connected to the three-dimensional memory cell array.

In example embodiments, the first direction may be a direction perpendicular to bitlines connected to the three-dimensional memory cell array.

In example embodiments, the conductive interconnections may be connected to the well regions and configured to receive the erase voltage or an unselect erase voltage during the erase operation.

According to example embodiments, a nonvolatile memory device may include: a substrate; a plurality of isolation insulating layers extending a first direction in the substrate; a plurality of well regions in the substrate, the well regions separated by the isolation insulating layers; and a three-dimensional memory cell array including a plurality of memory blocks on the substrate. Each of the memory blocks may include sub-blocks on corresponding ones of the well regions. The non-volatile memory device is configured to perform an erase operation in units of the sub-blocks by independently applying an erase voltage to a selected one of the well regions during the erase operation.

In example embodiments, the well regions may include a first well region, the first well region may be the selected one of the well regions during the erase operation, the first well region may correspond to a selected sub-block among the sub-blocks during the erase operation, and the non-volatile memory device may be configured to apply the erase voltage to the first well region during the erase operation.

In example embodiments, the well regions may include a second well region, the second well region may be an one of the well regions during the erase operation, the second well region may correspond to an unselected sub-block among the sub-blocks during the erase operation, the non-volatile memory device may be configured to apply an unselect erase voltage to the second well region or float the second well region during the erase operation.

In example embodiments, the non-volatile memory device may be configured to supply a voltage during the erase operation to wordlines that are connected to a selected one of the memory blocks, and the unselect erase voltage may be higher than the voltage supplied to wordlines connected to the selected one of the memory blocks during the erase operation.

According to example embodiments of inventive concepts, an erasing method of a nonvolatile memory device is provided. The nonvolatile memory device includes a plurality of well regions in a substrate that are divided by a plurality of isolation insulating layers extending in a first direction in the substrate, and a plurality of memory blocks on the substrate. Each of the memory blocks includes sub-blocks on corresponding ones of the well regions. The erasing method may include: selecting one of the memory blocks; floating string select lines connected to the selected memory block; applying a ground voltage to wordlines and a ground select line connected to the selected memory block; applying an erase voltage to a first well region among the well regions in the selected memory block, the first well region corresponding to a selected sub-block among the sub-blocks in the selected memory block; applying an unselect erase voltage to a second well region among the well regions in the selected memory block, the second well region corresponding to an unselected sub-block among the sub-blocks in the selected memory block; and floating the ground select line after the applying the erase voltage to the first well region.

In example embodiments, the second well region may be floated when the unselect erase voltage is applied to the second well region.

In example embodiments, the unselect erase voltage may be higher than a voltage applied to wordlines of the selected memory block.

In example embodiments, the first direction may be a direction parallel to bitlines connected to the memory blocks.

In example embodiments, the first direction may be a direction perpendicular to bitlines connected to the memory blocks.

According to example embodiments of inventive concepts, a nonvolatile memory device includes a memory cell array and a controller. The memory cell array includes a plurality of memory blocks on a support structure. The support structure includes a plurality of well regions separated in a first direction by one of doped regions and isolation insulating layers. Each of the memory blocks includes sub-blocks on corresponding ones of the well regions. The controller is configured to control an erase operation performed on the memory cell array in units of the sub-blocks. The controller is configured to independently apply an erase voltage to a selected one of the well regions during the erase operation.

In example embodiments, the support structure may include a substrate, a peripheral logic structure on the substrate, a lower filling insulating layer covering the peripheral logic structure, and a horizontal semiconductor layer on the lower filling insulating layer. The one of doped regions and isolation insulation layers may be the doped regions. The horizontal semiconductor layer may include the well regions separated in the first direction by the doped regions. A conductivity type of the doped regions may be opposite a conductivity type of the well regions.

In example embodiments, the support structure may include a substrate. The one of doped regions and isolation insulation layers may be the isolation insulation layers. The isolation insulating layers may extend in a second direction in the substrate. The second direction may be perpendicular to the first direction. The plurality of well regions may be in the substrate and separated in the first direction by the isolation insulating layers.

In example embodiments, each of the memory blocks may include a plurality of cell strings on the plurality of well regions of the support structure, respectively. Each of the cell strings may include a plurality of memory cells stacked vertically on each other between a ground select transistor and a string select transistor.

In example embodiments, the controller may be configured to apply an unselect voltage or a ground voltage to unselected well regions among the well regions during the erase operation, the controller may be configured to float string select line and ground select lines connected to the plurality of memory blocks during the erase operation, the controller may be configured to apply a voltage to word lines that are connected to a selected memory block among the plurality of memory blocks during the erase operation, the controller may be configured to apply a voltage that floats word lines that are connected to an unselected memory block among the plurality of memory blocks during the erase operation, and the unselect voltage may be higher than the voltage applied to the word lines that connected to the selected memory block and less than the voltage that floats the word lines that are connected to the unselected memory block during the erase operation.

In example embodiments, the controller may be configured to apply an unselect voltage to unselected ones of the well regions during the erase operation, and the controller may be configured to apply a ground voltage to word lines connected to a selected memory block among the plurality of memory blocks and float wordlines connected to an unselected memory block among the plurality of memory blocks during the erase operation. The unselect voltage may be between the ground voltage and the erase voltage. A voltage to float the wordlines connected to the unselected memory block may be between the unselect erase voltage and the erase voltage.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings:

FIG. 9 is a table illustrating an example of a bias condition of the memory block in FIG. 6 during an erase operation;

FIG. 10 is a table illustrating an example of a bias condition of the memory block in FIG. 6 during an erase operation;

DETAILED DESCRIPTION

Figure 1:
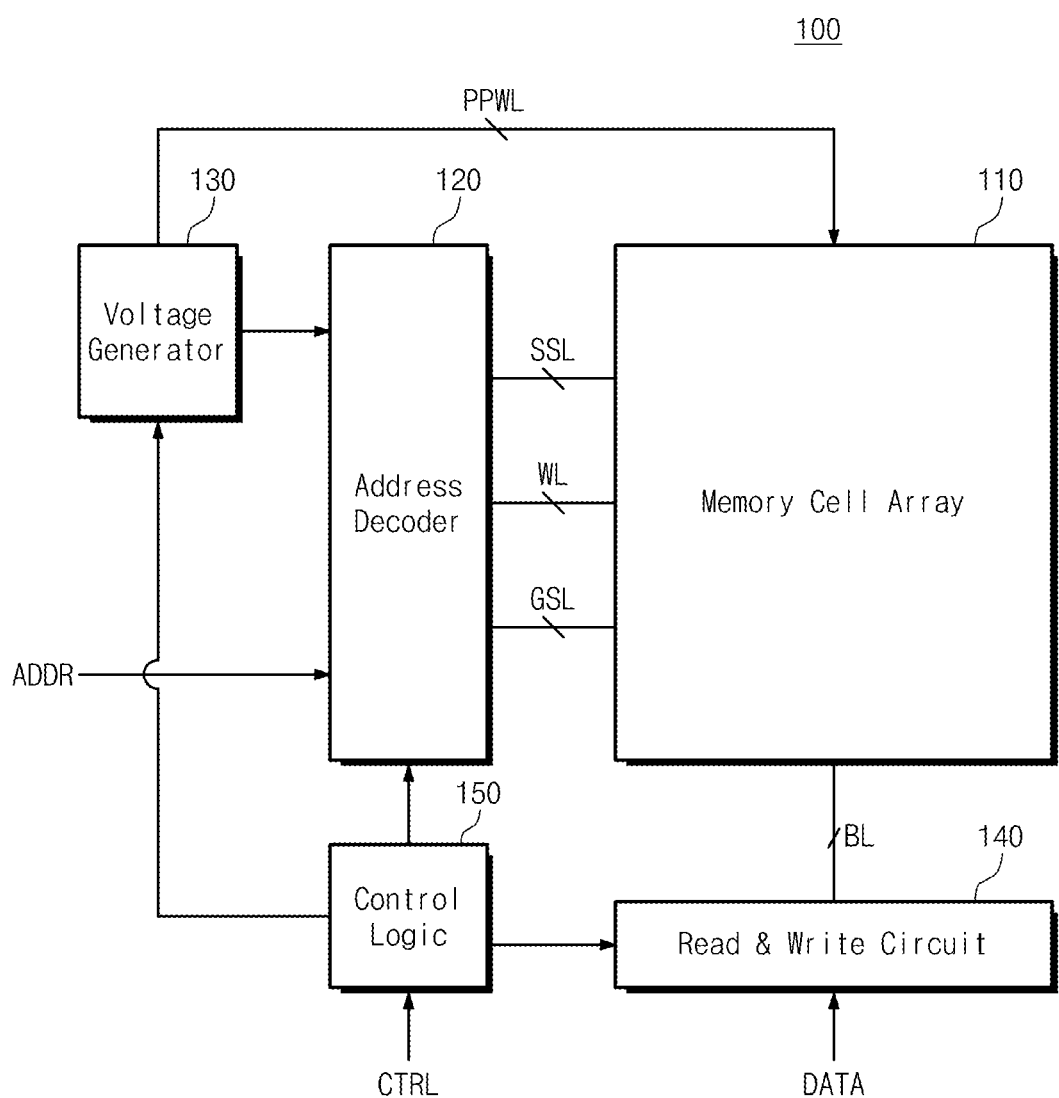
FIG. 1 is a block diagram of a nonvolatile memory device according to example embodiments of inventive concepts.

Example embodiments of inventive concepts will now be described more fully hereinafter with reference to the accompanying drawings, in which some example embodiments are shown. Example embodiments may, however, be embodied in many different forms and should not be construed as limited to the embodiments set forth herein. Rather, these example embodiments are provided so that this disclosure will be thorough and complete, and will fully convey the scope of example embodiments of inventive concepts to those skilled in the art. In the drawings, the thicknesses of layers and regions are exaggerated for clarity. Like reference characters and/or numerals in the drawings denote like elements, and thus their description may be omitted.

It will be understood that when an element is referred to as being "on" another element, it can be directly on the other element or intervening elements may be present therebetween. In contrast, when an element is referred to as being "directly on" another element, there are no intervening elements present. Other words used to describe the relationship between elements or layers should be interpreted in a like fashion (e.g., "between" versus "directly between," "adjacent" versus "directly adjacent," "on" versus "directly on"). As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments of inventive concepts.

The terminology used herein is for the purpose of describing particular embodiments only and is not intended to be limiting of example embodiments of inventive concepts. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Expressions such as "at least one of," when preceding a list of elements, modify the entire list of elements and do not modify the individual elements of the list.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which example embodiments of inventive concepts belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments of inventive concepts are described herein with reference to cross section illustrations that are schematic illustrations of idealized embodiments. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of example embodiments of inventive concepts.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, example embodiments of inventive concepts will now be described in detail with reference to the accompanying drawings.

FIG. 1 is a block diagram of a nonvolatile memory device 100 according to example embodiments of inventive concepts. Referring to FIG. 1, the nonvolatile memory device 100 includes a memory cell array 110, an address decoder 120, a voltage generator 130, a read/write circuit 140, and a control logic 150.

The memory cell array 110 is connected to the address decoder 120. The memory cell array 110 is connected to the read/write circuit 140 through bitlines BL. The memory cell array 110 includes a plurality of memory cells, which are stacked on a substrate. In example embodiments, a plurality of memory cells may store one or more bits per cell.

The address decoder 120 is connected to the memory cell array 110 through a plurality of lines (e.g., string select lines, wordlines, and ground select lines). The address decoder 120 is connected to the voltage generator 130. The address decoder 120 is configured to operate in response to the control of the control logic 150.

The address decoder 120 externally receives an address ADDR. The address decoder 120 may decode a row address among the address ADDR. The address decoder 120 may select a wordline corresponding to the decoded row address. According to the decoded row address, the address decoder 120 may apply voltages supplied from the voltage generator 130 to a plurality of lines to select a wordline corresponding to the address ADDR.

During an erase operation, the address decoder 120 may apply voltages supplied through the voltage generator 130 to some of the lines and may float some of the rest of the lines. The control logic 150 may control points of time when some of the rest of the lines are floated. In example embodiments, a selected wordline voltage may be applied to selected wordlines. Ground select lines may be floated after the lapse of specific delay time from a point of time when an erase voltage is applied to a substrate or a semiconductor layer of the memory cell array 110.

During the erase operation, an erase voltage may be applied to a substrate or a semiconductor layer. The substrate or the semiconductor layer may include a plurality of isolation regions. The substrate or the semiconductor layer may include a plurality of well regions divided by the isolation regions. The memory cell array 110 may include a plurality of memory blocks. Each of the memory blocks may include a plurality of sub-blocks. The sub-blocks correspond to the well regions, respectively. The well regions may be connected to the voltage generator 130 through well line PPWL. The nonvolatile memory device 100 may independently apply a voltage to the well regions during the erase operation. An erase voltage may be applied to a selected well region, and an unselect erase voltage may be applied to an unselected well region. Thus, the nonvolatile memory device 100 may perform an erase operation in units of sub-blocks.

The address decoder 120 is configured to decode a column address among the received address ADDR. The address decoder 120 transmits the decoded column address to the read/write circuit 140. In example embodiments, the address decoder 120 may include a row decoder to decode a row address, a column decoder to decode a column address, and an address buffer to store an address ADDR.

The voltage generator 130 is connected to the control logic 150 and the address decoder 120. The voltage generator 130 may operate according to the control of the control logic 150. The voltage generator 130 may be configured to generate a high voltage. In example embodiments, a voltage generated by the voltage generator 130 may be transferred to a plurality of lines connected to the memory cell array 110 through the address decoder 120.

The voltage generator 130 may be connected to the substrate or the semiconductor layer of the memory cell array 110. A plurality of well regions in the substrate or the semiconductor layer may be connected to the voltage generator 130 through well lines PPWL (see FIG. 8). A voltage generated by the voltage generator 130 may be transferred to the substrate or the semiconductor layer of the memory cell array 110.

The read/write circuit 140 is connected to the memory cell array 110 through bitlines BL. The read/write circuit 140 operates in response to the control of the control logic 150. The read/write circuit 140 receives a decoded column address from the address decoder 120. The read/write circuit 140 may select bitlines BL using the decoded column address.

In example embodiments, during a program operation, the read/write circuit 140 may externally receive data DATA and program the received data into the memory cell array 110. During a read operation, the read/write circuit 140 may read the data DATA from the memory cell array 110 and transmit the read data DATA to an external entity. The read/write circuit 140 may read data from a first storage area of the memory cell array 110 and write the read data into a second storage area of the memory cell array 110. For example, the read/write circuit 140 may perform a copyback operation.

In example embodiments, the read/write circuit 140 may include components such as a page buffer (or page register) and a column selection circuit. In example embodiments, the read/write circuit 140 may include components such as a sense amplifier, a write driver, and a column selection circuit.

In example embodiments, although not shown in FIG. 1, the nonvolatile memory device 100 may further include a component such as a buffer circuit. In this case, the buffer circuit may externally receive data to be programmed during a program operation and transmit data read data to an external entity during a read operation. The read/write circuit 140 may receive data from the buffer circuit during a program operation and transmit read data from the memory cell array 110 to the buffer circuit during a read operation.

The control logic 150 is connected to the address decoder 120, the voltage generator 130, and the read/write circuit 140. The control logic 150 is configured to control the overall operation of the nonvolatile memory device 100. The control logic 150 operates in response to a control signal CTRL that is externally transmitted.

During an erase operation, the control logic 150 may control the voltage generator 130 to transfer an erase voltage and an unselect erase voltage generated by the voltage generator 130 to the substrate or the semiconductor layer of the memory cell array 110. According to example embodiments of inventive concepts, the control logic 150 may control the voltage generator 130 to apply an erase operation to a well region corresponding to a selected sub-block during an erase operation. The control logic 150 may control the voltage generator 130 to apply an unselect erase voltage to a well region corresponding to an unselected sub-block during an erase operation.

Figure 2:
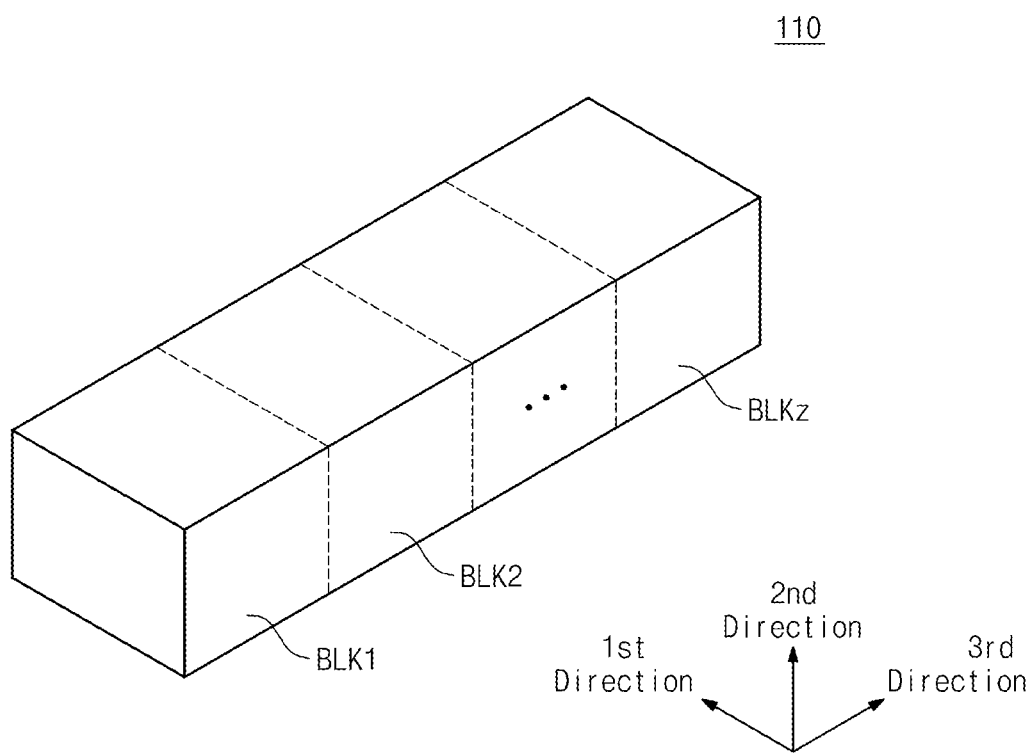
FIG. 2 is a block diagram of a memory cell array in FIG. 1.

FIG. 2 is a block diagram of the memory cell array 110 in FIG. 1. Referring to FIG. 2, the memory cell array 110 includes a plurality of memory blocks BLK1 to BLKz. Each of the memory blocks BLK1 to BLKz has a three-dimensional structure. For example, each of the memory blocks BLK1 to BLKz may include structures extending in first to third directions. Each of the memory blocks BLK1 to BLKz may include a plurality of NAND strings NS extending in the second direction. A plurality of NAND strings Ns may be provided in the first and third directions.

Each of the memory blocks BLK1 to BLKz is connected to a plurality of bitlines BL, a plurality of string select lines, a plurality of ground select lines, a plurality of wordlines, and a common source line. Each of the NAND strings NS is connected to a bitline, a string select line, a ground select line, wordlines, and a common source line. Each of the memory blocks BLK1 to BLKz will be explained in further detail later with reference to FIG. 4.

The memory blocks BLK1 to BLKz may be selected by the address decoder 120 shown in FIG. 1. For example, the address decoder 120 is configured to select a memory block BLK corresponding to a decoded row address among the memory blocks BLK1 to BLKz.

Figure 3:
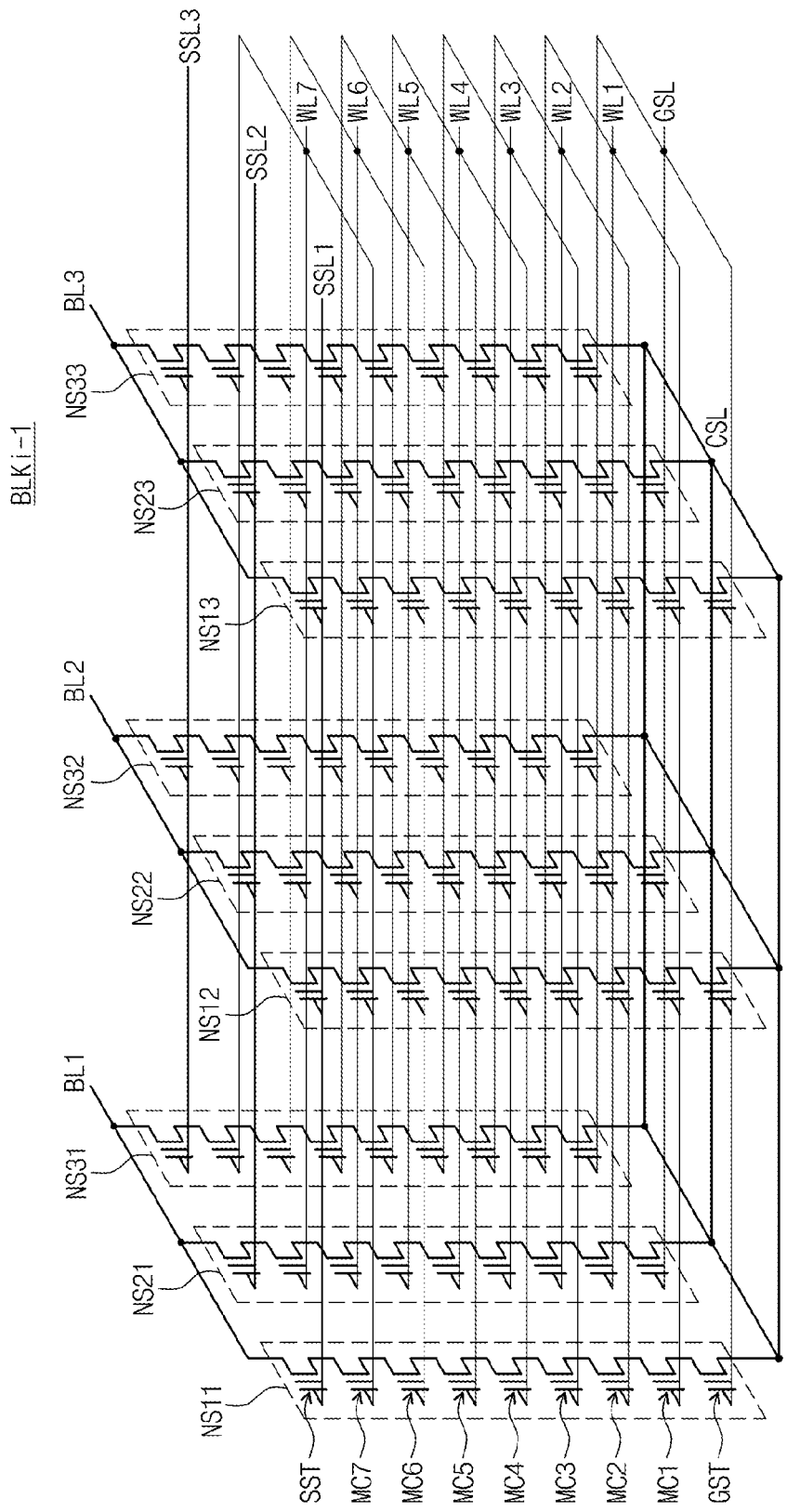
FIG. 3 is a circuit diagram of an equivalent circuit according to an example of one of the memory blocks in FIG. 2 according to example embodiments.

FIG. 3 is a circuit diagram of an equivalent circuit according to an example of one of the memory blocks BLKi-1 among the memory blocks BLK1 to BLKz in FIG. 2. Referring to FIG. 3, NAND strings NS11 to NS31 are provided between a first bitline BL1 and a common source line CSL. NAND strings NS12 to NS32 are provided between a second bitline BL2 and the common source line CSL. NAND strings NS13 to NS33 are provided between a third bitline BL3 and the common source line CSL.

Each NAND string NS includes a string select transistor SST, a ground select transistor GST, and a plurality of memory cells MC coupled between the string select transistor SST and the ground select transistor GST. The string select transistor SST of each NAND string NS is connected to a corresponding bitline BL. The ground select transistor of each NAND string NS is connected to a common source line CSL.

Hereinafter, NAND strings NS will be described in units of rows and columns. NAND strings NS connected to a single bitline BL constitute a single column. For example, NAND strings NS11 to NS31 connected to the first bitline BL1 may correspond to a first column. NAND strings NS12 to NS32 connected to a second bitline BL2 may correspond to a second column. NAND strings NS13 to NS33 connected to a third bitline BL3 may correspond to a third column.

NAND strings NS connected to a single string select line SSL constitute a single row. For example, NAND strings NS11 to NS13 connected to a first string select line SSL1 constitute a first row. NAND strings NS21 to NS23 connected to a second string select line SSL2 constitute a second row. NAND strings NS31 to NS33 connected to a third string select line SSL3 constitute a third row.

In each NAND string NS, height is defined. For example, a height of a memory cell MC1 adjacent to a ground select transistor GST is 1. In each NAND string NS, the more the memory cell is close to the string select transistor SST, the more height of a memory cell increases. For example, in FIG. 3, a height of a memory cell MC7 adjacent to the string select transistor SST is 7. However, example embodiments are not limited thereto and the number of memory cells (e.g., MC) in each NAND string NS may alternatively be greater or less than 7.

NAND strings NS of the same row share a string select line SSL. NAND strings of different rows are connected to different string select lines SSL. The NAND strings NS11 to NS13, NS21 to NS22, and NS31 to NS33 share a ground select line GSL. Memory cells at the same height of NAND strings NS of the same row share a wordline. At the same height, wordlines WL of NAND strings NS of different rows are commonly connected. The common source line CSL is commonly connected to the NAND strings NS.

As shown in FIG. 3, wordlines WL of the same height are commonly connected. Thus, all NAND strings NS connected to a specific wordline WL may be selected when the specific wordline WL is selected. NAND strings NS of different rows are connected to different string select lines SSL. Thus, among NAND strings NS connected to the same wordline WL, NAND strings NS of an unselected row may be separated from bitlines BL1 to BL3 by selecting string select lines SSL1 to SSL3. That is, a row of NAND strings NS may be selected by selecting the string select lines SSL1 to SSL3. In addition, NAND strings NS of a selected row may be selected in units of columns by selecting the bitlines BL1 to BL3.

The memory block BLKi-1 may include a plurality of sub-blocks Sub-block1, Sub-block2, and Sub-block3. The sub-block Sub-block1 may include NAND strings NS11 to NS13. The sub-block Sub-block2 may include NAND strings NS21 to NS22. The sub-block Sub-block3 may include NAND strings NS31 to NS33. The nonvolatile memory device 100 according to example embodiments of inventive concepts may perform an erase operation in units of sub-blocks.

Figure 4:
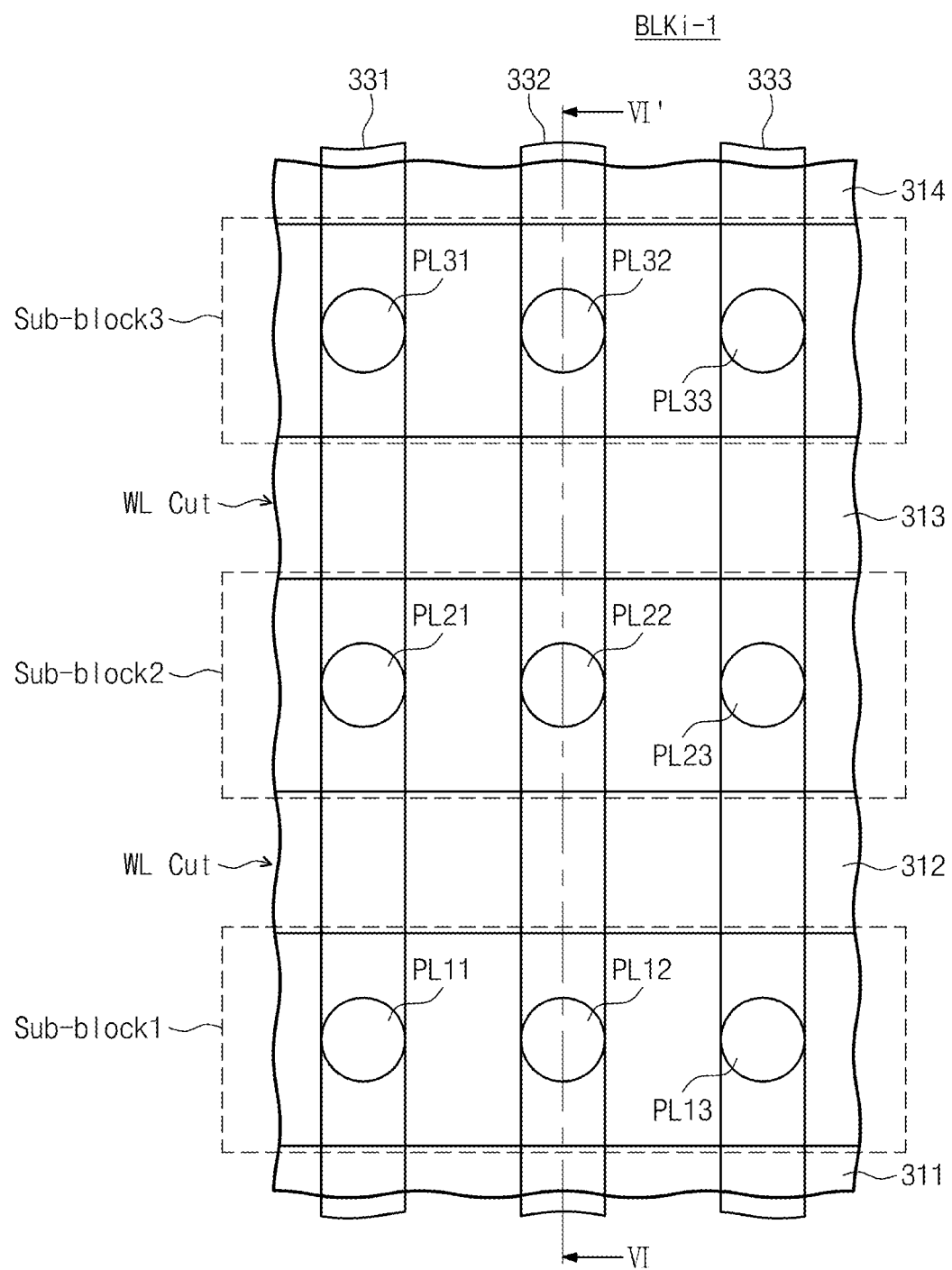
FIG. 4 is a top plan view illustrating an example of a structure corresponding to the memory block in FIG. 3.
Figure 5:
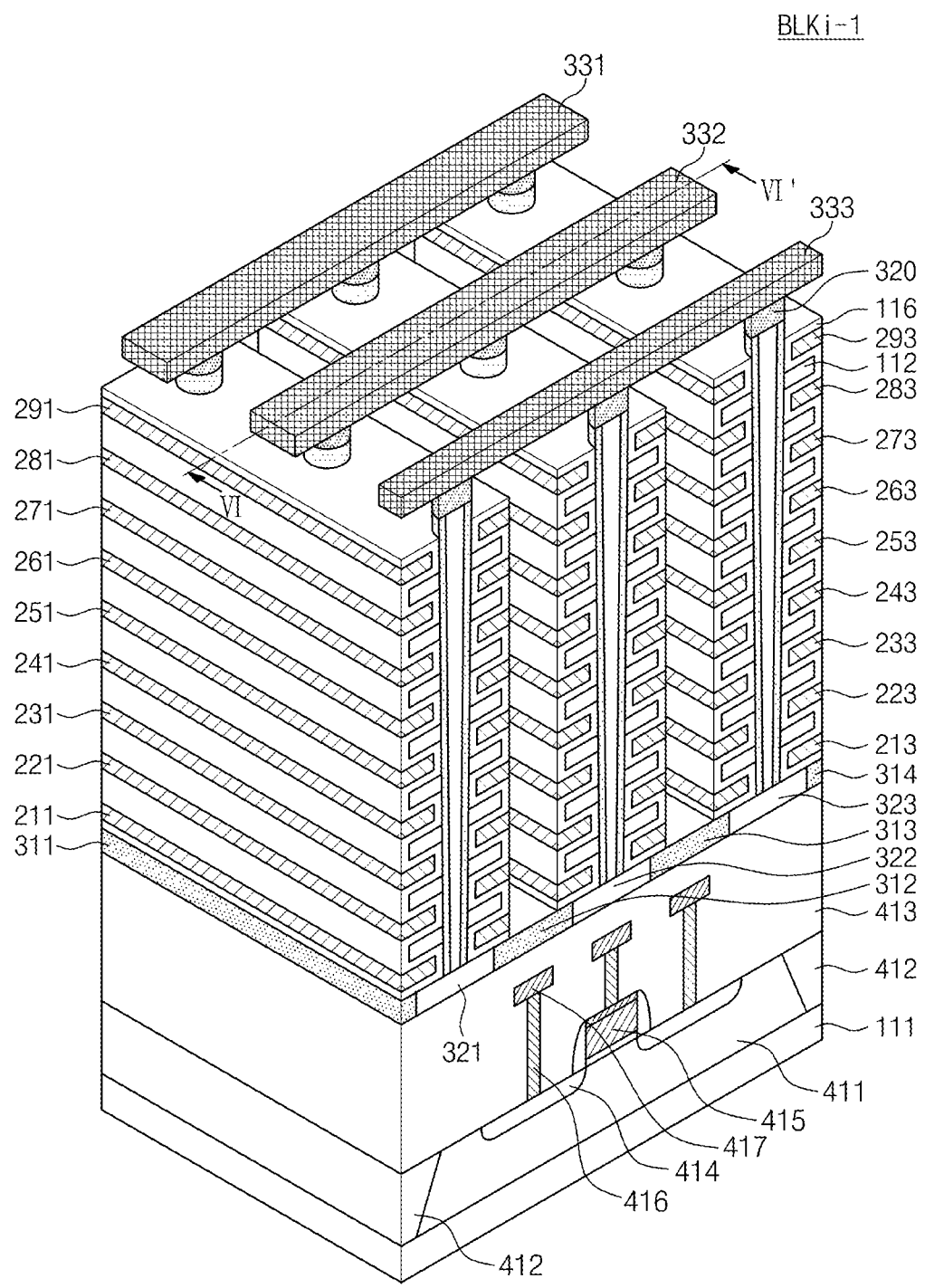
FIG. 5 is a perspective view illustrating an example of a structure corresponding to the memory block in FIG. 3.
Figure 6:
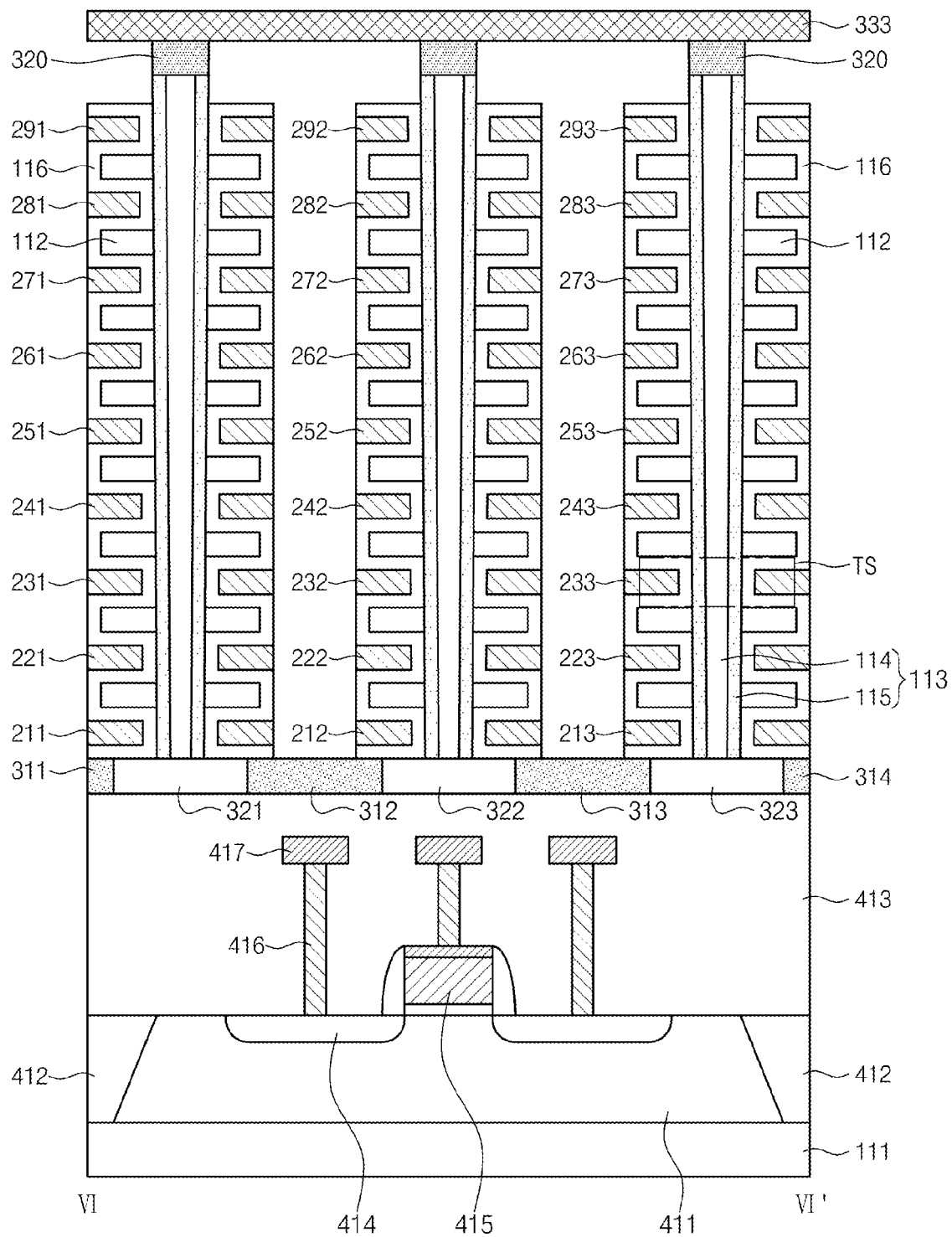
FIG. 6 is a cross-sectional view taken along a line VI-VI' of the memory block in FIG. 5.

FIG. 4 is a top plan view illustrating an example of a structure corresponding to the memory block BLKi-1 in FIG. 3. FIG. 5 is a perspective view illustrating an example of a structure corresponding to the memory block BLKi-1 in FIG. 3. FIG. 6 is a cross-sectional view taken along a line VI-VI' of the memory block BLKi in FIG. 5. Referring to FIGS. 4 to 6, the memory block BLKi-1 includes structures extending in first to third directions.

A support structure S may include a substrate 111, a well region 411 and a device isolation layer 412 on the substrate 111, and a peripheral logic structure and a cell array structure on the substrate 111.

In example embodiments, the substrate 111 may include a semiconductor doped with first-type impurities. For example, the substrate 111 may include a silicon material doped with first-type impurities. For example, the substrate 111 may include a silicon material doped with p-type impurities. For example, the substrate 111 may be a p-type well (e.g., pocket p-well). Hereinafter, let it be assumed that the substrate 111 may be p-type silicon substrate. However, the substrate 111 is not limited to the p-type silicon substrate.

The peripheral logic structure and a cell array structure may be sequentially stacked on the substrate 111. To put it another way, the peripheral logic structure may be disposed between the substrate 111 and the cell array structure when viewed vertically. That is, a peripheral circuit region and a cell array region may overlap when viewed from above.

The peripheral logic structure may include an address decoder 120 (see FIG. 1), a control logic 130, and a read/write circuit 140. These peripheral circuits may be formed on the entire surface of the substrate 111. The substrate 111 may include a well region 411 doped with n-type or p-type impurities. In the well region 411, active regions may be defined by a device isolation layer 412.

The peripheral logic structure may include a peripheral wordline 415, source and drain impurity regions 414 at opposite sides of the peripheral wordline 415, and a lower filling insulating layer 413 to cover peripheral circuits. More specifically, PMOS transistors may be formed on an n-well region and NMOS transistors may be formed on a p-well region. The peripheral wordline 415 may be disposed on the n-well region and the p-well region, and source and drain impurity regions 414 may be disposed at opposite sides of the peripheral wordline 415. Peripheral circuit plugs 416 and peripheral circuit interconnections 417 may be connected to the NMOS and PMOS transistors.

The cell array structure may include a horizontal semiconductor layer formed on the lower filling insulating layer 413 to cover peripheral circuits and may include stack structures including conductive materials 211-291, 212-292, and 213-293 vertically stacked on a horizontal semiconductor layer and a plurality of pillars 113 penetrating the stack structures, respectively.

The horizontal semiconductor layer may include silicon (Si), germanium (Ge) or a combination thereof and may be a layer of a semiconductor doped with impurities of a first conductivity type or a layer of an intrinsic semiconductor (undoped semiconductor). The horizontal semiconductor layer may have a crystal structure including at least one material selected from a single crystalline structure, an amorphous structure, and a polycrystalline structure.

A plurality of doped regions 311-314 extending in the first direction are provided within the horizontal semiconductor layer. The horizontal semiconductor layer includes a plurality of well regions 321-323 separated by the doped regions 311-314. For example, the doped regions 311-314 may have a second conductivity type different from that of the well regions 321-323. For example, the doped regions 311-314 may have an n-type. Hereinafter, let it be assumed that first to fourth doped regions 311-314 may have an n-type. However, the conductivity type of the first to fourth doped regions 311-314 is not limited to the n-type.

A plurality of pillars 113 are provided on a corresponding well region 321 between the first and second doped regions 311 and 312. The pillars 113 are sequentially disposed in the first direction and penetrate insulating materials 112 in the second direction. In example embodiments, the pillars 113 may be in contact with the well region 321 through the insulating materials 112.

In example embodiments, each of the pillars 113 may include a plurality of materials. For example, the surface layer 114 of each of the pillars 113 may include a silicon material doped with first-type impurities. Hereinafter, let it be assumed that a surface layer 114 of each of the pillars 113 includes p-type silicon. However, a material included in the surface 114 of each of the pillars 113 is not limited the p-type silicon.

An inner layer 115 of each of the pillars 113 includes an insulating material. For example, the inner layer 115 of each of the pillars 113 may include silicon oxide. For example, the inner layer 115 of each of the pillars 113 may include an air gap.

On the well region 321 between the first and second doped regions 311 and 312, an insulating layer 116 is provided along exposed surfaces of the insulating materials 112, the pillars 113, and the well region 321.

The insulating materials 112 include a first material and a second material below the first material. In example embodiments, thickness of the insulating layer 116 may be smaller than half a distance between the insulating materials 112. That is, apart from the insulating materials 112 and the insulating layer 116, another material may be disposed in a space that may be provided between the insulating layer 116 provided on a bottom surface of the first insulating material and the insulating layer 116 provided on a top surface of the second insulating material.

In a region between the first and second doped regions 311 and 312, first conductive materials 211-291 may be provided on an exposed surface of the insulating layer 116. For example, a first conductive material 211 extending in the first direction is provided between the well region 321 and an insulating material 112 adjacent to the well region 321.

A plurality of first conductive materials 221-281 extending in the first direction are provided between the insulating materials 112. In example embodiments, first conductive materials 211-291 may be metal materials. In example embodiments, the first conductive materials 211-291 may be conductive materials such as polysilicon.

The same structure as that on the well region 321 may be provided on the well region 322 between the second and third doped regions 312 and 313. In example embodiments, a plurality of insulating materials 112 extending in the first direction, a plurality of pillars 113 sequentially disposed in the first direction and penetrating the insulating materials 112 in the second direction, an insulating layer 116 provided on exposed surfaces of the insulating materials 112 and the pillars 113, and a plurality of first conductive materials 212-292 extending in the first direction are provided on the well region 322.

The same structure as that on the well region 321 may be provided on the well region 323 between the third and fourth doped regions 313 and 314. In example embodiments, a plurality of insulating materials 112 extending in the first direction, a plurality of pillars 113 sequentially disposed in the first direction and penetrating the insulating materials 112 in the second direction, an insulating layer 116 provided on exposed surfaces of the insulating materials 112 and the pillars 113, and a plurality of first conductive materials 213-293 extending in the first direction are provided on the well region 323.

Drains 320 are provided on the pillars 113, respectively. In example embodiments, the drains 320 may be silicon materials doped with second-type impurities. For example, the drains 320 may be silicon materials doped with an n-type dopant. Hereinafter, let it be assumed that the drains 320 include n-type silicon. However, a material included in the drains 320 is not limited to the n-type silicon. In example embodiments, width of each of the drains 320 may be greater than that of a corresponding pillar 113. For example, each of the drains 320 may be provided on a top surface of a corresponding pillar 113 in the form of a pad.

Conductive materials 331-333 extending in a third direction are provided on the drains 320. The conductive materials 331-333 are sequentially disposed in the first direction. The conductive materials 331 to 333 are connected to drains 320 in a corresponding region, respectively. In example embodiments, the drains 320 and the conductive material 333 extending in the third direction are connected through contact plugs, respectively. In example embodiments, the conductive materials 331-333 extending in the third direction may be metal materials. In example embodiments, the conductive materials 331-333 extending in the third direction may be conductive materials such as polysilicon.

In FIGS. 5 and 6, each of the pillars 113 constitute a NAND string NS together with the insulating layer 116 and a plurality of conductive lines 211-291, 212-292, and 213-293 extending in the first direction. The NAND string NS includes a plurality of transistor structures TS. A transistor structure TS will be explained below in further detail with reference to FIG. 7.

Figure 7:
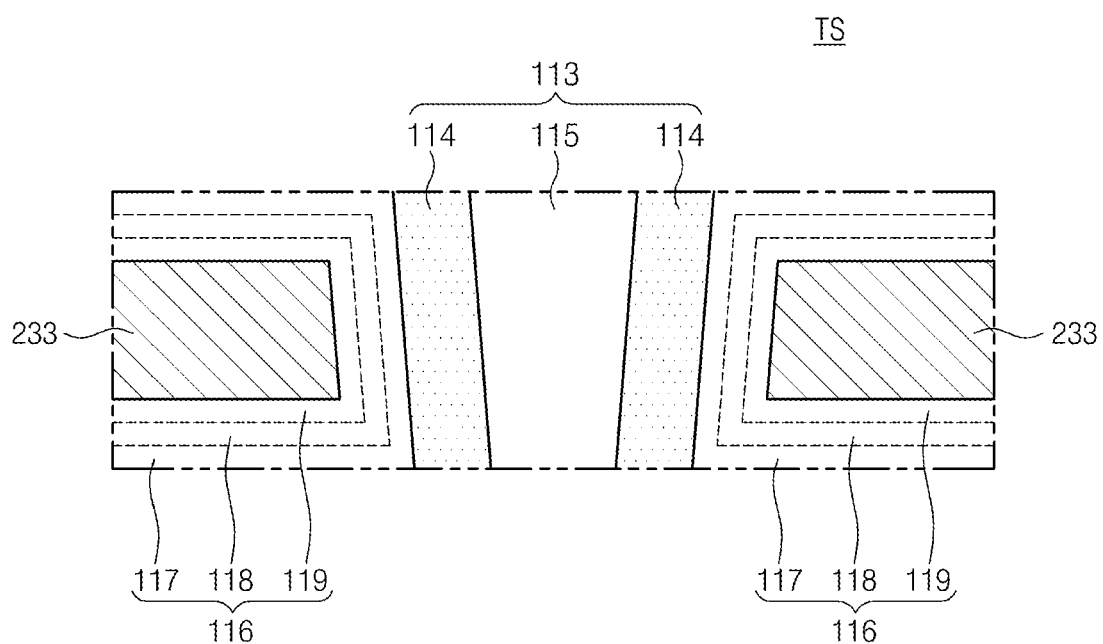
FIG. 7 is a cross-sectional view of a transistor structure in FIG. 6.

FIG. 7 is a cross-sectional view of the transistor structure TS in FIG. 6. Referring to FIGS. 5 to 7, the insulating layer 116 includes at least three sub-insulating layers 117, 118, and 119.

P-type silicon 114 of the pillar 113 may act as a body. A first sub-insulating layer 117 adjacent to the pillar 113 may act as a tunneling insulating layer. For example, the first sub-insulating layer 117 adjacent to the pillar 113 may include thermal oxide.

A second sub-insulating layer 118 may act as a charge storage layer. For example, the second sub-insulating layer 118 may act as a charge trap layer. For example, the second sub-insulating layer 118 may include nitride or metal oxide (e.g., aluminum oxide, hafnium oxide, etc.).

A third sub-insulating layer 119 adjacent to the conductive material 233 may act as a blocking insulating layer. For example, the third sub-insulating layer 119 adjacent to the conductive material 233 extending in the first direction may include a single layer or multiple layers. The third sub-insulating layer 119 may be a high-k dielectric layer (e.g., an aluminum oxide layer, a hafnium oxide layer, etc.) having a higher dielectric constant than the first and second sub-insulating layers 117 and 118.

The conductive material 233 may act as a gate (or control gate). That is, the gate (or control gate) 233, the blocking insulating layer 119, the charge storage layer 118, the tunneling insulating layer 117, and the body 114 may constitute a transistor (or memory cell transistor structure). For example, the first to third sub-insulating layers 117 to 119 may constitute oxide-nitride-oxide (ONO). Hereinafter, the p-type silicon 114 of the pillar 113 will be referred to as a second-direction body.

The memory block BLKi-1 includes a plurality of pillars 113. That is, the memory block BLKi-1 includes a plurality of NAND strings NS. More specifically, the memory block BLKi-1 includes a plurality of NAND strings NS extending in the second direction (or a direction perpendicular to a substrate).

Each of the NAND strings NS includes a plurality of transistor structures TS disposed in the second direction. At least one of the transistor structures TS acts as a string select transistor SST. At least one of the transistor structures TS acts as a ground select transistor GST.

The gates (or control gates) correspond to conductive materials 211-291, 212-292, and 213-293 extending in the first direction. That is, the gates (or control gates) extend in the first direction to form wordlines and at least two select lines (e.g., at least one string select line SSL and at least one ground select line GSL).

The conductive materials 331-333 extending in the third direction are connected to one end of NAND strings NS. In example embodiments, the conductive materials 331-333 extending in the third direction act as bitlines BL. That is, in a single memory block BLKi-1, a plurality of NAND strings are connected to a single bitline BL.

Second-type doped regions 311-314 extending in the first direction are provided to the other end of NAND strings. Second-type doped regions 311-314 extending in the first direction act as common source lines CSL.

To sum up, the memory block BLKi-1 includes a plurality of NAND strings extending a direction perpendicular to the substrate 111 (the second direction) and acts as a NAND flash memory block (e.g., charge trap type) where a plurality of NAND strings NS are connected to a single bitline BL.

As explained in FIGS. 5 to 7, the conductive lines 211-291, 212-292, and 213-293 extending in the first direction are provided to nine layers. However, the inventive concept is not limited to the above explanation. For example, the conductive lines 211-291, 212-292, and 213-293 extending in the first direction may be provided to eight layers, sixteen layers or a plurality of layers. That is, in a single NAND string, eight, sixteen or a plurality of layers may be provided.

As explained in FIGS. 5 to 7, three NAND strings NS are connected to a single bitline BL. However, the inventive concept is not limited to the above explanation. In example embodiments, in a memory block BLKi-1, m NAND strings NS may be connected to a single bitline BL. In this case, the number of the conductive materials 211-291, 212-292, and 213-293 extending in the first direction and the number of the common source lines 311-314 may be adjusted as many as the number of the NAND strings NS connected to the single bitline BL.

As explained in FIGS. 5 to 7, three NAND strings NS are connected to a single conductive material extending in the first direction. However, the inventive concept is not limited to the above explanation. For example, n NAND strings NS may be connected to a single conductive material extending in the first direction. In this case, the number of the bitlines 331-333 may also be adjusted as many as the NAND strings NS connected to the single conductive material extending in the first direction.

As shown in FIGS. 5 to 7, width of the pillar 113 varies depending on height of the memory cell MC. In example embodiments, the width of the pillar 113 may vary depending on a process characteristic or error. For example, the more the height of the memory cell MC decreases (i.e., the more a distance between a string select line SSL and a wordline WL increases), the more the width of the pillar 113 decreases.

The pillar 113 includes a silicon oxide layer 117 acting as a tunneling insulating layer, a silicon nitride layer 118 acting as a charge storage layer, and a silicon oxide layer 119 acting as a blocking insulating layer. Due to a difference in voltage between the gate (or control gate) and the body 114, an electric field is established between the gate (or control gate) and the body 114. The electric field is distributed to the tunneling insulating layer 117, the charge storage layer 118, and the blocking insulating layer 119.

The electric field distributed to the tunneling insulating layer 117 causes Fowler-Nordheim (FN) tunneling. That is, the memory cell MC is programmed or erased by the electric field distributed to the tunneling insulating layer 117. The number of charges trapped to the charge storage layer 118 during a program operation or the number of charges discharged from the charge storage layer 118 during an erase operation may be decided according to the electric field distributed to the tunneling insulating layer 117.

The electric field is distributed to the tunneling insulating layer 117, the charge storage layer 118, and the blocking insulating layer 119 based on capacitances of the tunneling insulating layer 117, the charge storage layer 118, and the blocking insulating layer 119. The more the width of the pillar 113 decreases, the more an area ratio of the tunneling insulating layer 117 to the blocking insulating layer 119 decreases. The more the area ratio of the tunneling insulating layer 117 to the blocking insulating layer 119 decreases, the more a ratio of the capacitance of the tunneling insulating layer 117 to the capacitance of the blocking insulating layer 119 decreases. The more the ratio of the capacitance of the tunneling insulating layer 117 to the capacitance of the blocking insulating layer 119 decreases, the more the electrical field distributed to the tunneling insulating layer 117 increases.

Accordingly, the more the width of the pillar 113 decreases, the more the amount of the charges trapped to the charge storage layer 118 during the program operation or the number of the charges discharged from the charge storage layer 118 during the erase operation increases. That is, the magnitude of the tunneling effect is changed by width difference of the pillar 113 and the variation amount of a threshold voltage of memory cells MC1 to MC7 is changed by the width difference of the pillar 113.

In order to compensate difference in tunneling effect (or variation amount of a threshold voltage) of memory cells MC depending on the width of the pillar 113, the address decoder 120 (see FIG. 2) and the voltage generator 130 are configured to adjust the level of a wordline voltage applied to a wordline WL according to a position of the wordline WL. In example embodiments, the address decoder 120 and the voltage generator 130 are configured to adjust levels of a select voltage applied to a selected wordline, an unselect voltage applied to an unselected wordline, and a wordline erase voltage applied during an erase operation.

The voltage generator 130 may independently apply a voltage to each of a plurality of well regions 321-323 during an erase operation. NAND strings respectively corresponding to the well regions 321-323 may constitute a sub-block. In example embodiments, the nonvolatile memory device 100 may independently apply a voltage to each of the well regions 321-323 to perform an erase operation in units of sub-blocks.

Accordingly, a plurality of sub-blocks Sub-block1, Sub-block2, and Sub-block3 may divide NAND strings connected to string select lines SSL1, SSL2, and SSL3 in a memory block into a plurality of groups. For example, the first sub-block Sub-block1 may include NAND strings NS11 to NS13 connected to the first string select line SSL1. The second sub-block Sub-block2 may include NAND strings NS21 to NS23 connected to the second string select line SSL2. The third sub-block Sub-block3 may include NAND strings NS31 to NS33 connected to the third string select line SSL3.

Figure 8:
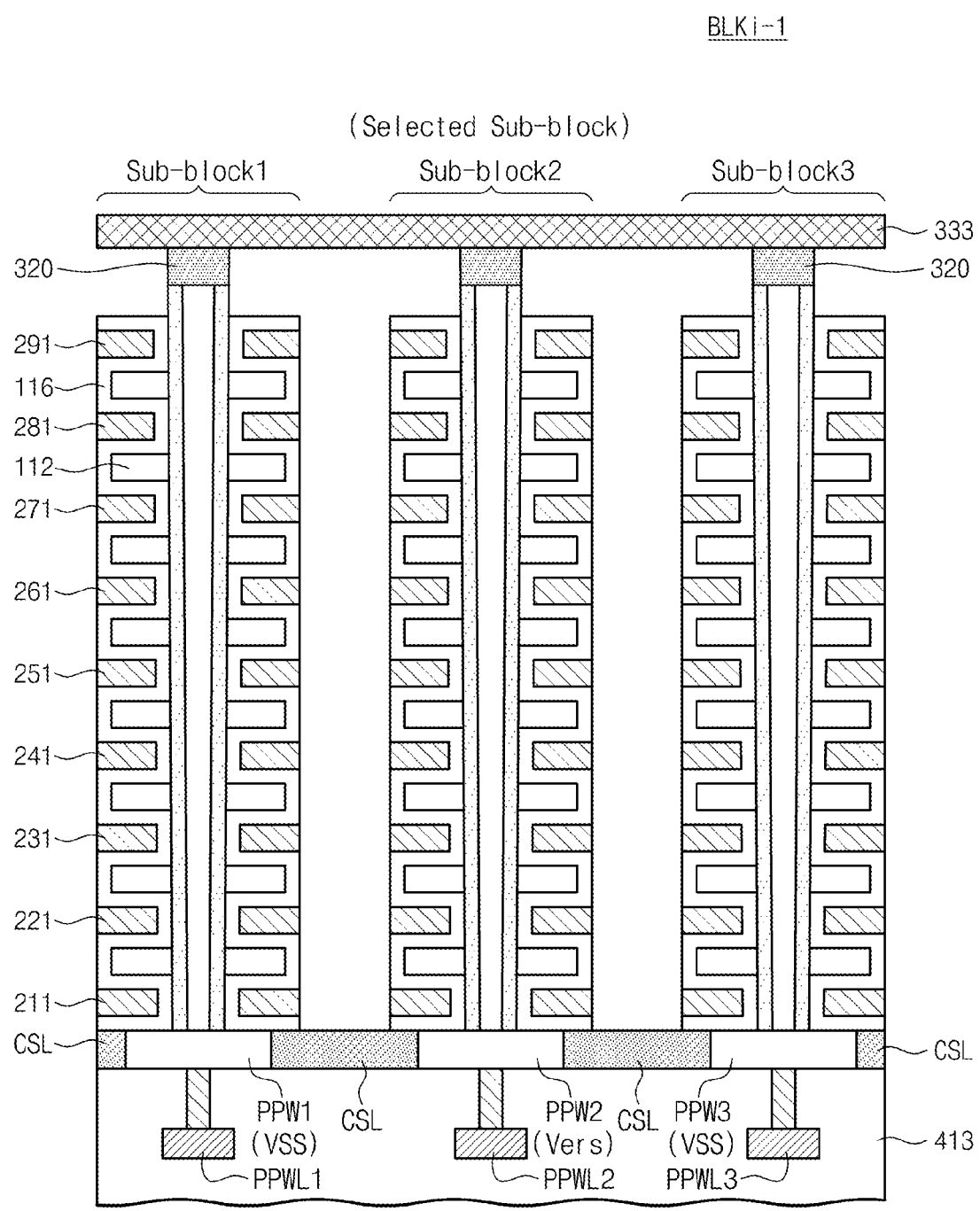
FIG. 8 is a cross-sectional view showing a state of the memory block in FIG. 6 during an erase operation.

FIG. 8 is a cross-sectional view showing a state of the memory block BLKi-1 in FIG. 6 during an erase operation, and FIG. 9 is a table illustrating an example of a bias condition of the memory block in FIG. 6 during an erase operation. Referring to FIGS. 8 and 9, the memory block BLKi-1 includes a plurality of sub-blocks Sub-block1, Sub-block2, and Sub-block3. In the explanation with reference to FIG. 8, let it be assumed that the second sub-block Sub-block2 is erased and the first and third sub-blocks Sub-block1 and Sub-block are erase-inhibited.

String select lines SSL are floated during an erase operation. Ground select lines GSL are floated after the lapse of specific delay time from a point of time when an erase voltage Vers is applied. A ground select line GSL may be floated after receiving a ground voltage VSS. Among a plurality of memory blocks, one memory block BLKi-1 may be selected. A voltage supplied to wordlines WL of a selected memory block is different from a voltage applied to wordlines WL of an unselected memory block. Wordlines WLs of the selected memory block may be applied with a ground voltage VSS, while wordlines WLs of the unselected memory block may be floated. After a memory block is selected, one of the sub-blocks is selected.

For example, when the second sub-block Sub-block2 is selected, an erase voltage Vers may be applied to a well region PPW2. A ground voltage VSS may be applied to well regions PPW1 and PPW3 corresponding to unselected sub-blocks Sub-block1 and Sub-block3. Thus, an erase operation may be performed only on the selected sub-block Sub-block2.

The well regions PPW1 to PPW3 may be connected to pocket well lines PPWL1 to PPWL3 formed at the lower filling insulating layer 413, respectively. The pocket well lines PPWL1 to PPWL3 are connected to the voltage generator 130 (see FIG. 1).

FIG. 10 is a table illustrating an example of a bias condition of the memory block in FIG. 6 during an erase operation. Referring to FIG. 10, an unselect erase voltage may be applied to well regions PPW1 and PPW3 corresponding to an unselected sub-block. Alternatively, the well regions PPW1 and PPW3 corresponding to the unselected sub-block may be floated.

When voltages are applied under the bias condition of FIG. 9, an unintentional erase or program operation may be performed in an unselected memory block. Referring to FIG. 9, even in an unselected memory block, an erase voltage Vers may be induced in a channel. Since wordlines WLs of the unselected memory block are in a floating state, a voltage of the wordlines WLs increases. For example, when a voltage of 0 volt is applied to a selected well region Selected PPW in the unselected memory block and a voltage of 20 volts is applied to an unselected well region Unselected PPW, floated wordlines WLs have a voltage of 10 volts. Thus, an unintentional program operation may be performed in an unselected sub-block corresponding to an unselected well region Unselected PPW in the unselected memory block. An intentional erase operation may be performed in a selected sub-block corresponding to a selected well region Selected PPW in the unselected memory block.

Accordingly, if a voltage is applied to the well regions Selected PPW and Unselected PPW under the bias condition of FIG. 10, the above-explained unintentional erase or program operation may be limited and/or prevented. Referring to FIG. 10, a well region Unselected PPW corresponding to an unselected sub-block is applied with an unselect erase voltage Vuners. Alternatively, the well region Unselected PPW corresponding to an unselected sub-block may be floated. Thus, the wordlines WLs of the unselected block may have a higher voltage than that in case of FIG. 9. In the selected memory block, a difference in voltage between the wordlines WLs and the selected well region Selected PPW or between the wordlines WLs and the unselected well region Unselected PPW is reduced. As a result, an unintentional erase or program operation may be limited and/or prevented from occurring in the unselected memory block.

Figure 11:
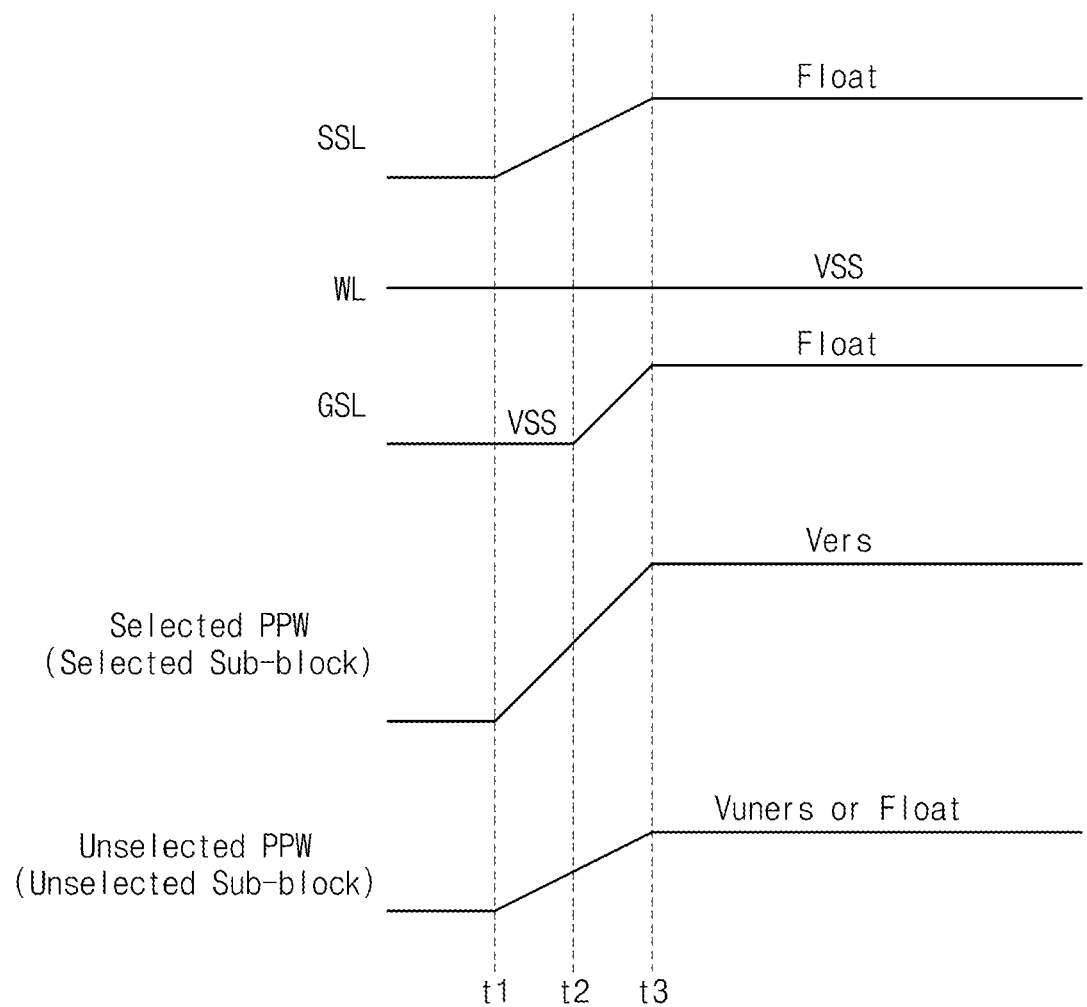
FIG. 11 is a timing diagram illustrating voltage variation of a selected memory block according to the bias condition in FIG. 10.

FIG. 11 is a timing diagram illustrating voltage variation of a selected memory block according to the bias condition in FIG. 10. Referring to FIGS. 8 to 11, let it be assumed that the second sub-block Sub-block2 is a sub-block to be erased. That is, the second sub-block Sub-block2 is a selected sub-block and the first and third sub-blocks Sub-block1 and Sub-block3 are unselected sub-blocks.

At first time t1, an erase voltage Vers starts to be applied to the second well region PPW2. The erase voltage Vers may be a high voltage. An unselect erase voltage Vuners starts to be applied to the first and third regions PPW1 and PPW3. Alternatively, the first and third regions PPW1 and PPW3 may be floated.

At the first time t1 when the erase voltage Vers starts to be applied, a ground voltage VSS is applied to a ground select line GSL. At the time t1 when the erase voltage Vers starts to be applied, the ground voltage VSS is applied to wordlines WL of a selected memory block.

Between the first time t1 and second time t2, a difference between each of voltages of a ground select line GSL and wordlines WL and the erase voltage Vers may be maintained. Thus, an increasing erase voltage Vers may be stably supplied to a surface layer 114 corresponding to memory cells MC1 to MC7 of the second sub-block.

String select line SSL is floated from the time t1 when the erase voltage Veras starts to be applied. A voltage of the string select lines SSL may increase due to coupling effect. String select transistors SST may be erase-inhibited.

After third time t3, a difference between the erase voltage Vers and the voltage of the wordlines WL may cause FN tunneling at the memory cells MC1 to MC7 of the second sub-block Sub-block2. Data of the memory cells of the second sub-block Sub-block2 may be erased.

A difference between the unselect erase voltage Vuners and the voltage of the wordlines WL may not cause FN tunneling at the memory cells MC1 to MC7 of the first and third sub-blocks Sub-block1 and Sub-block3. Data of the memory cells MC1 to MC7 of the first and third sub-blocks Sub-block1 and Sub-block3 may be erase-inhibited.

Thus, an erase operation may be performed in units of sub-blocks in a selected memory block.

Figure 12:
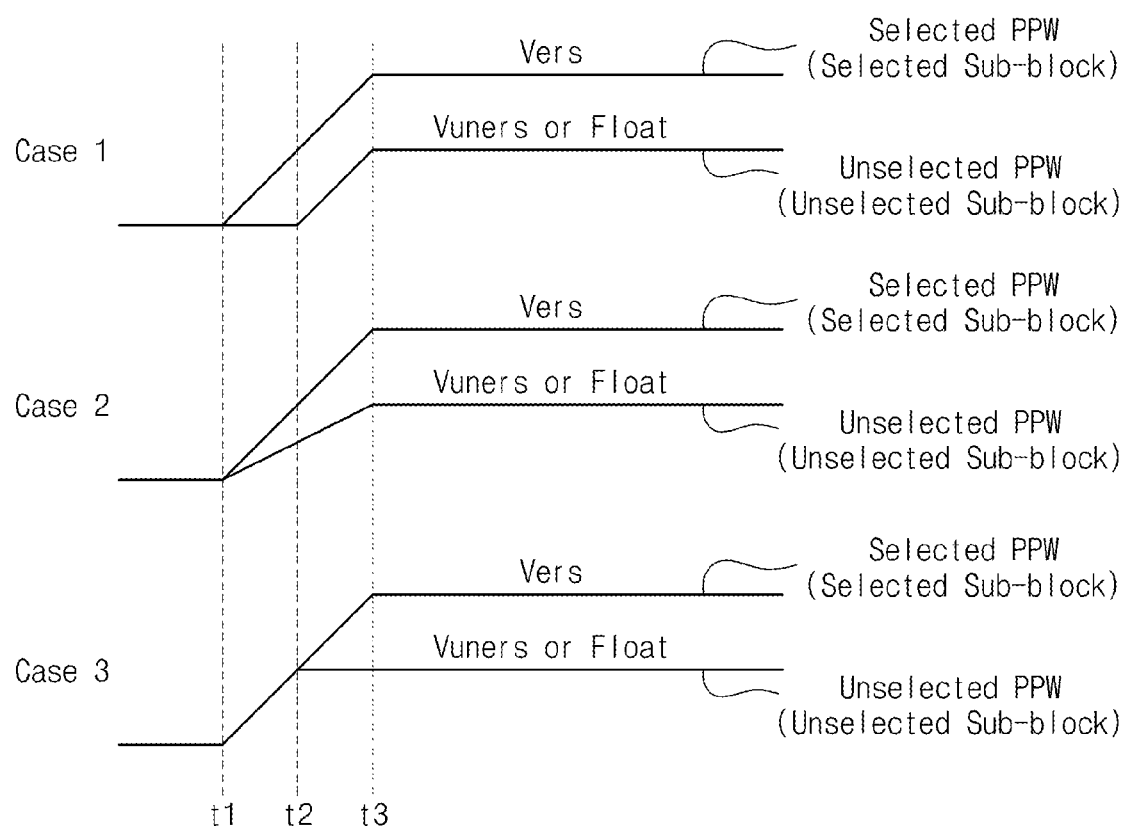
FIG. 12 is a timing diagram illustrating examples of voltage variations of a selected well region and an unselected well region in FIG. 11.

FIG. 12 is a timing diagram illustrating examples of voltage variations of a selected well region Selected PPW and an unselected well region Unselected PPW in FIG. 11. Referring to FIG. 12, voltages of a selected well region Selected PPW and an unselected well region Unselected PPW may vary depending on first to third cases Case1 to Case3.

In the first case Case1, a voltage of the selected well region Selected PPW may increase from first time t1. The voltage of the selected well region Selected PPW may increase to an erase voltage Vers. A voltage of the unselected well region Unselected PPW may increase from second time t2. The voltage of the unselected well region PPW may increase to an unselect erase voltage Vuners. Alternately, the voltage of the unselected well region Unselected PPW may increase in a floating state.

In the second case Case2, the voltage of the selected well region Selected PPW may increase from the first time t1. The voltage of the selected well region Selected PPW may increase to the erase voltage Vers. The voltage of the unselected well region Unselected PPW may also increase from the first time t1. The voltage of the unselected well region Unselected PPW may increase to the unselect erase voltage Vuners at the third time t3. Alternatively, the voltage of the unselected well region Unselected PPW may increase to the third time t3 in a floating state. Thus, the voltage of the unselected well region Unselected PPW may increase at a different tilt than the voltage of the selected well region Selected PPW.

In the third case Case3, the voltage of the selected and unselected well regions Selected PPW and Unselected PPW may simultaneously increase at the same tilt from the first time t1. The voltage of the unselected well region Unselected PPW may increase to the second time t2. The voltage of the unselected well region Unselected PPW may increase to the unselect erase voltage Vuners. Alternatively, the voltage of the unselected well region Unselected PPW may increase in a floating state. The voltage of the selected well region Selected PPW may increase to the third time t3. The voltage of the selected well region Selected PPW may increase to the erase voltage Vers.

Figure 13:
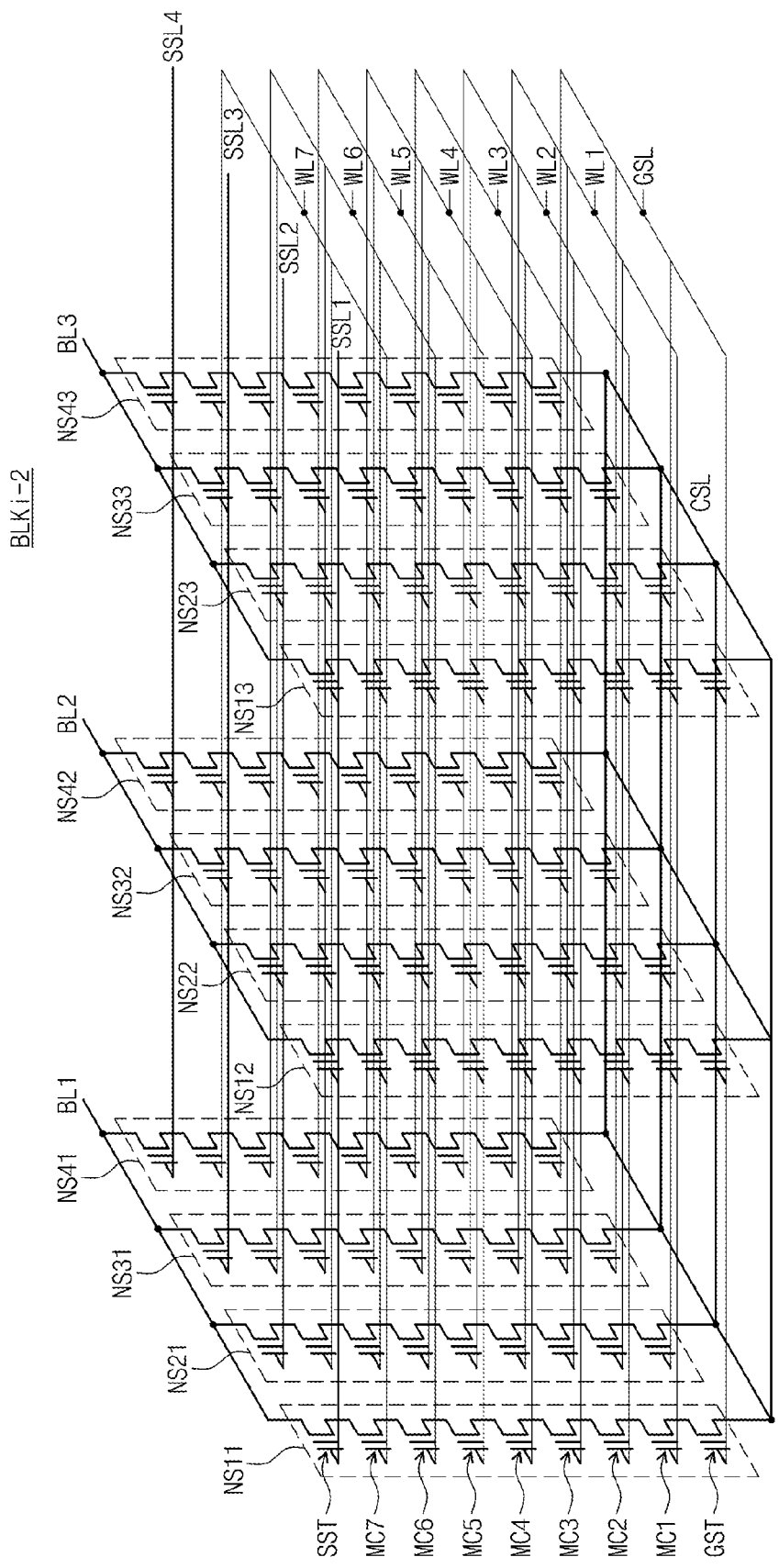
FIG. 13 is a circuit diagram of an equivalent circuit according to an example of one of the memory blocks in FIG. 2 according to example embodiments.

FIG. 13 is a circuit diagram of an equivalent circuit according to an example of one of the memory blocks BLK1 to BLKz in FIG. 2. Referring to FIG. 13, the memory block BLKi-2 may include sub-blocks Sub-block1 and Sub-block2. The configuration of the memory block BLKi-2 is similar to that of the memory block BLKi-1 in FIG. 3 and will not be explained in further detail.

In FIG. 13, NAND strings NS11 to NS41 are provided between a first bitline BL1 and a common source line CSL. NAND strings NS12 to NS42 are provided between a second bitline BL2 and the common source line CSL. NAND strings NS13 to NS43 are provided between a third bitline BL3 and the common source line CSL.

The first sub-block Sub-block1 includes NAND strings NS11 to NS13 and NS21 to NS23. The second sub-block Sub-block2 includes NAND strings NS31 to NS33 and NS41 to NS43.

The sub-blocks Sub-block1 and Sub-block2 may be divided by isolation well regions in a substrate. During an erase operation, a voltage may be independently applied to the isolation well regions in the substrate.

Figure 14:
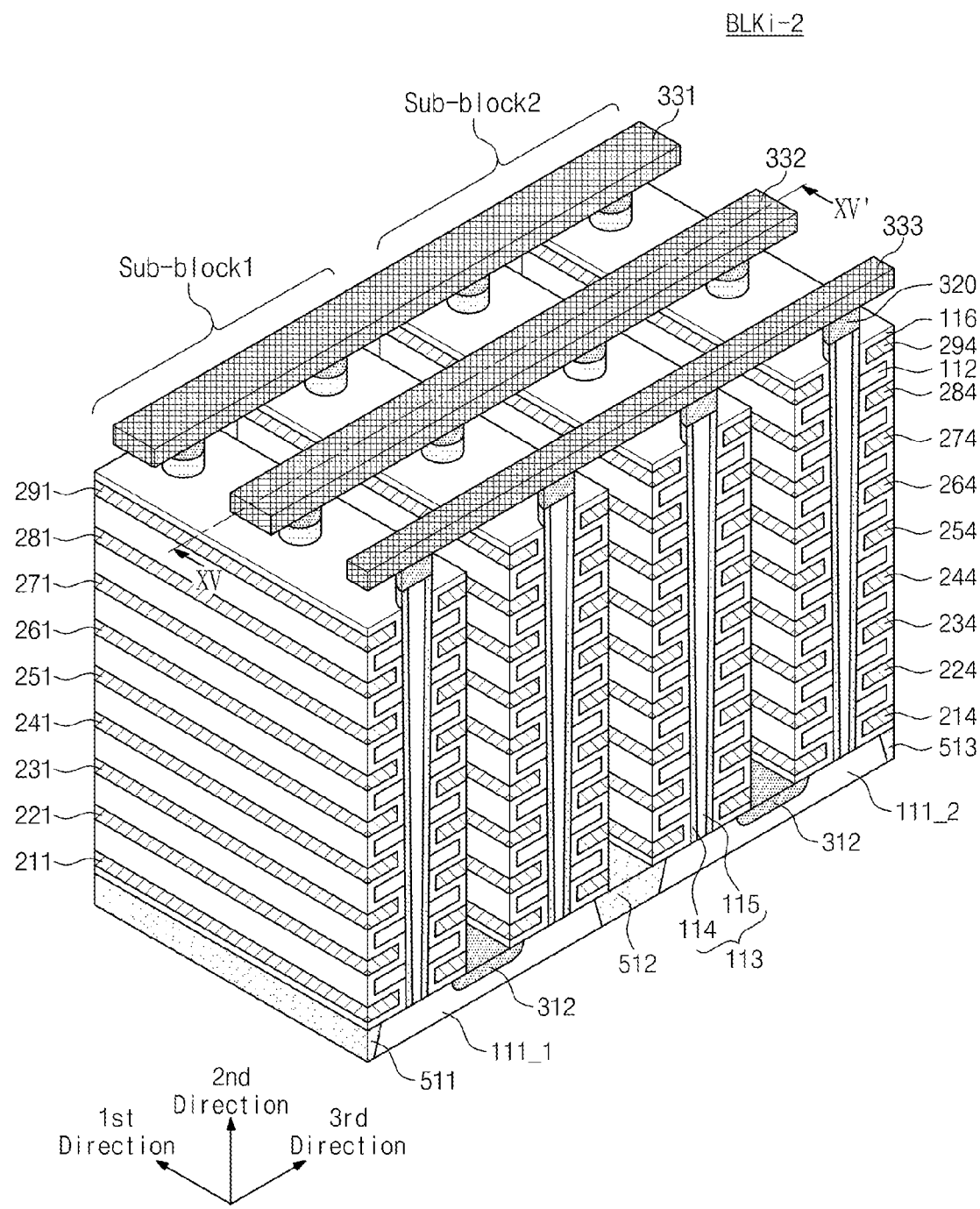
FIG. 14 is a perspective view illustrating an example of a structure corresponding to the memory block in FIG. 13.
Figure 15:
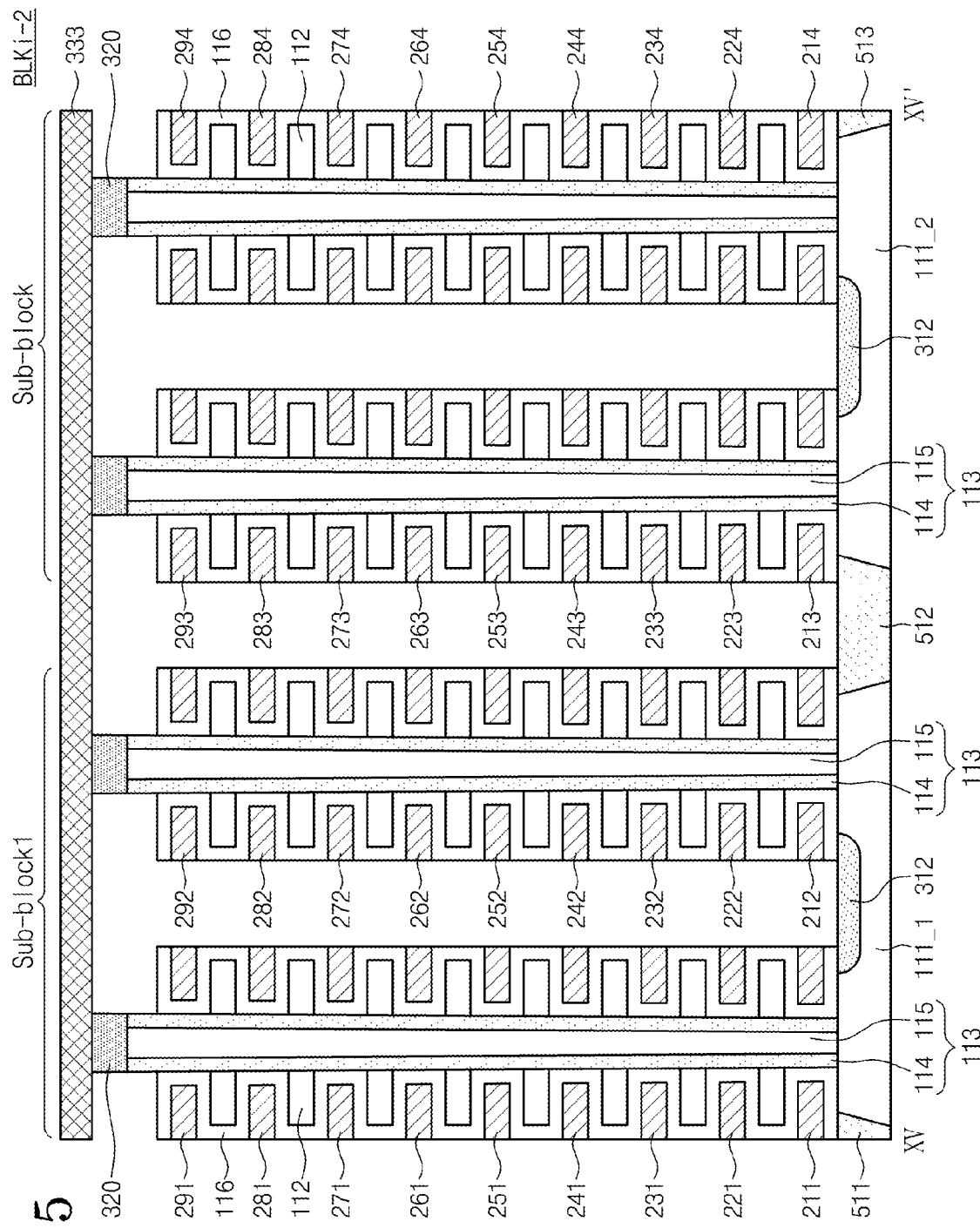
FIG. 15 is a cross-sectional view taken along a line XV-XV' of the memory block in FIG. 14.

FIG. 14 is a perspective view illustrating an example of a structure corresponding to the memory block BLKi-2 in FIG. 13, and FIG. 15 is a cross-sectional view taken along a line XV-XV' of the memory block BLKi-2 in FIG. 14. Referring to FIGS. 14 and 15, the memory blocks BLKi-2 include structures extending in first to third directions.

A support structure S may include a substrate including a semiconductor material (e.g., silicon). In example embodiments, the substrate may be a well having a first type (e.g., first conductivity type). For example, the substrate may be a P-well formed by implanting a group 3 element such as boron (B). For example, the substrate may be a pocket p-well provided in an n-well. Hereinafter, let it be assumed that the substrate has a p-type well (or p-type packet well). However, the conductivity type of the substrate is not limited to the p-type.

The substrate includes a plurality of isolation regions 511-513. The substrate includes a plurality of well regions 111_1 and 111_2 divided by the isolation regions 511-513.

A plurality of doped regions 311 and 312 extending in the first direction are provided on the well regions 111_1 and 111_2. For example, the doped regions 311 and 312 may have a second type (e.g., second conductivity type) different from the well regions 111_1 and 111_2. For example, the doped regions 311 and 312 may have an n-type. However, the conductivity type of the first and second doped regions 311 and 312 is not limited to the n-type.

A plurality of insulating materials 112 extending in the first direction are sequentially provided on the well regions 111_1 and 111_2 in the second direction. In example embodiments, the insulating materials 112 may include an insulating material such as silicon oxide. The insulating materials 112 may be provided to be spaced apart from each other at specific intervals in the second direction.

A plurality of pillars 113 penetrating the insulating materials 113 in the second direction are sequentially provided on the well regions 111_1 and 111_2 in the first direction. In example embodiments, the pillars 113 may be in contact with the well regions 111_1 and 111_2 through the insulating materials 1123.

In example embodiments, each of the pillars 113 may include a plurality of materials. For example, a surface layer 114 of each of the pillars 113 may include a silicon material having a first conductivity type. For example, the surface layer 114 of each of the pillars 113 may include a silicon material having the same conductivity type as the well regions 111_1 and 111_2. Hereinafter, let it be assumed that the surface layer 114 of each of the pillars 113 may include p-type silicon. However, a material included in the surface layer 114 of each of the pillars 113 is not limited to the p-type silicon.

An inner layer 115 of each of the pillars 113 includes an insulating material. For example, the inner layer 115 of each of the pillars 113 may include an insulating layer such as silicon oxide. For example, the inner layer 115 of each of the pillars 113 may include an air gap.

On the well regions 111_1 and 111_2, an insulating layer 116 is provided along exposed surfaces of the insulating materials 112, the pillars 113, and the well region 111_1 and 111_2.

In example embodiments, thickness of the insulating layer 116 may be smaller than half a distance between the insulating materials 112. That is, apart from the insulating materials 112 and the insulating layer 116, another material may be disposed in a space that may be provided between the insulating layer 116 provided on a bottom surface of the first insulating material and the insulating layer 116 provided on a top surface of the second insulating material.

On the well regions 111_1 and 111_2, first conductive materials 211-291, 212-292, 213-293, and 214-294 are provided on an exposed surface of the insulating layer 116. For example, first conductive materials 211, 212, 213, and 214 extending in the first direction are provided between the well regions 111_1 and 111_2 and an insulating material 112 adjacent to the well regions 111_1 and 111_2.

A plurality of first conductive materials 221-281, 222-282, 223-283, and 224-284 extending in the first direction are provided between the insulating materials 112. In example embodiments, the first conductive materials 211-291, 212-292, 213-293, and 214-294 are metal materials. In example embodiments, the first conductive materials 211-291, 212-292, 213-293, and 214-294 may conductive materials such as polysilicon.

Drains 320 are provided on the pillars 113, respectively. In example embodiments, the drains 320 may include silicon materials doped with second-type impurities. Hereinafter, let it be assumed that the drains 320 may include n-type silicon materials. However, materials included in the drains 320 are not limited to the n-type silicon materials.

In example embodiments, width of each of the drains 320 may be greater than that of a corresponding pillar 113. For example, each of the drains 320 may be provided on a top surface of a corresponding pillar 113 in the form of a pad. In example embodiments, each of the drains 320 may extend to a portion of a surface layer 114 of a corresponding pillar 113.

Second conductive materials 331-333 extending in the third direction are provided on the drains 320. The second conductive materials 331-333 are disposed to be spaced apart from each other at specific intervals in the first direction. The second conductive materials 331-333 are connected to drains 320 in a corresponding region, respectively. In example embodiments, the drains 320 and the second conductive material 333 extending in the third direction are connected to each other through contact plugs, respectively. In example embodiments, the second conductive materials 331-333 may be metal materials. In example embodiments, the second conductive materials 331-333 may be conductive materials such as polysilicon.

Hereinafter, heights of the first conductive materials 211-291, 212-292, 213-293, and 214-294 will be defined. The first conductive materials 211-291, 212-292, 213-293, and 214-294 are defined to have first to ninth heights sequentially from the well regions 111_1 and 111_2. That is, the first conductive materials 211-214 adjacent to the well regions 111_1 and 111_2 have the first height. The first conductive materials 291-294 adjacent to the second conductive materials 331-333 have the ninth height. The more the order from a plurality of well regions 111_1 and 111_2 of a specific one of the first conductive materials 211-291, 212-292, 213-293, and 214-294 increases, the more height of the first conductive material increases.

In FIGS. 14 and 15, each of the pillars 113 may constitute a string together with the insulating layer 116 and the conductive materials 211-291, 212-292, 213-293, and 214-294. For example, each of the pillars 113 constitute a NAND string NS together with an adjacent region of the insulating layer 116 and an adjacent region among the first conductive materials 211-291, 212-292, 213-293, and 214-294. The NAND string NS includes a plurality of transistor structures TS.

As explained in FIGS. 14 and 15, the first conductive materials 211-291, 212-292, 213-293, and 214-294 are provided to nine layers. However, the inventive concept is not limited to the above explanation. For example, the conductive materials may be provided to eight layers constituting memory cells and at least two layers constituting select transistors. The first conductive materials may be provided to sixteen layers constituting memory cells and at least two layers constituting select transistors.

A sectional area of the pillar 113 according to the first and third directions may vary depending on a process characteristic or error. As shown in FIGS. 14 and 15, the sectional area of the pillar 113 according to the first and third directions may decrease as the pillar 113 closely approaches the well regions 111_1 and 111_2. The pillar 113 may be formed by providing materials such as a silicon material and an insulating material to a hole formed by etching. The more etched depth increases, the more an area of the hole formed by the etching according to the first and third directions may decrease.

The first sub-block Sub-block1 includes NAND strings formed on the first well region 111_1. The second sub-block Sub-block2 includes NAND strings formed on the second well region 111_2.

During an erase operation, an erase voltage is applied to a well region of a selected one of the sub-blocks Sub-block1 and Sub-block2. An unselect erase voltage Vuners is applied to a well region of an unselected one of the sub-blocks Sub-block1 and Sub-block2. Alternatively, the well region of the unselected sub-block is floated. Thus, the nonvolatile memory device 100 according to the inventive concept may independently apply a voltage to each of the well regions 111_1 and 111_2 to perform an erase operation in units of the sub-blocks.

Accordingly, the sub-blocks Sub-block1 and Sub-block2 may divide NAND strings connected to string select lines SSL in a memory block into a plurality of groups. For example, the first sub-block Sub-block1 may include NAND strings NS11 to NS13 and NS21 to NS23 connected to the first and second string select lines SSL1 and SSL2. The second sub-block Sub-block2 may include NAND strings NS31 to NS33 and NS41 to NS43 connected to the third and fourth string select lines SSL3 and SSL4.

Figure 16:
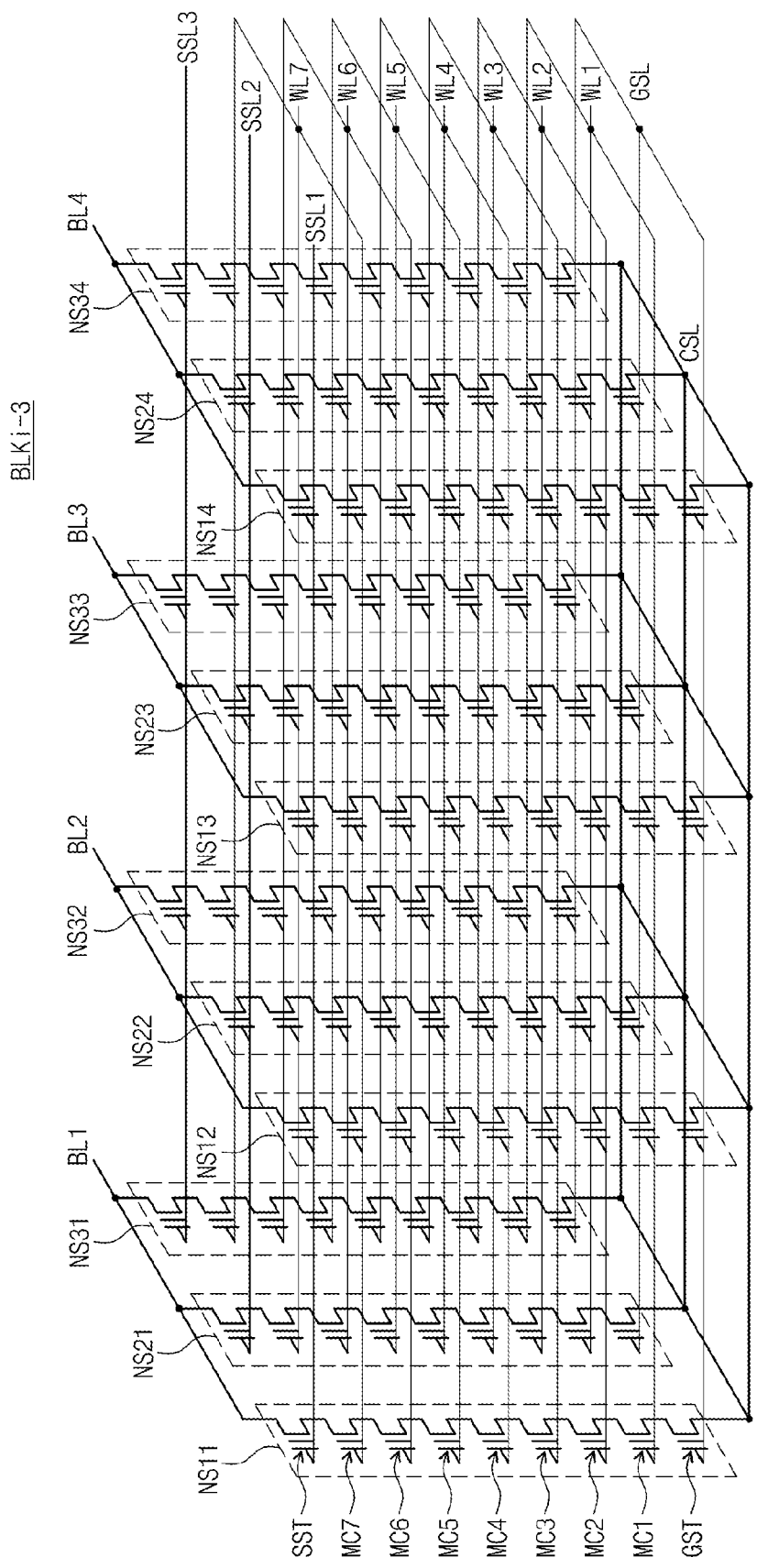
FIG. 16 is a circuit diagram of an equivalent circuit according to an example of one of the memory blocks in FIG. 2 according to example embodiments.

FIG. 16 is a circuit diagram of an equivalent circuit according to an example of one of the memory blocks BLK1-BLKz in FIG. 2. Referring to FIG. 16, the memory block BLKi-3 may include sub-blocks Sub-block1 and Sub-block2. The configuration of the memory block BLKi-3 is identical to that of the memory block BLKi-1 in FIG. 3 and will not explained in further detail.

In FIG. 16, NAND strings NS11 to NS31 are provided between a first bitline BL1 and a common source line CSL. NAND strings NS12 to NS32 are provided between a second bitline BL2 and the common source line CSL. NAND strings NS13 to NS33 are provided between a third bitline BL3 and the common source line CSL. NAND strings NS14 to NS34 are provided between a fourth bitline BL4 and the common source line CSL.

A first sub-block Sub-block1 includes NAND strings NS11 to NS31 and NS12 to NS32. A second sub-block Sub-block2 includes NAND strings NS13 to NS33 and NS14 to NS34.

The sub-blocks Sub-block1 and Sub-block2 may be divided by isolated well regions in a substrate. During an erase operation, a voltage may be independently applied to each of the isolated well regions in the substrate.

Figure 17:
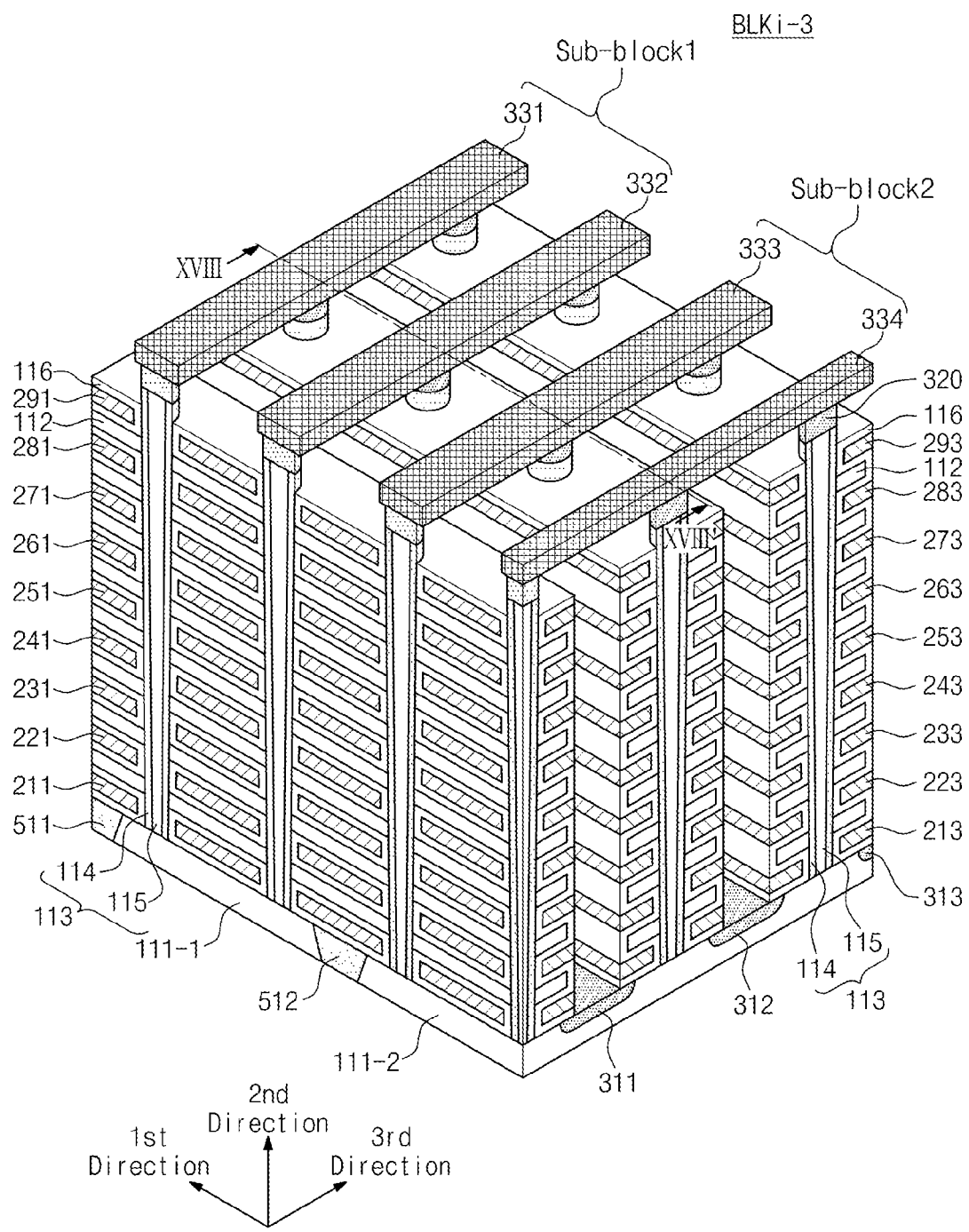
FIG. 17 is a perspective view illustrating an example of a structure corresponding to the memory block in FIG. 16.
Figure 18:
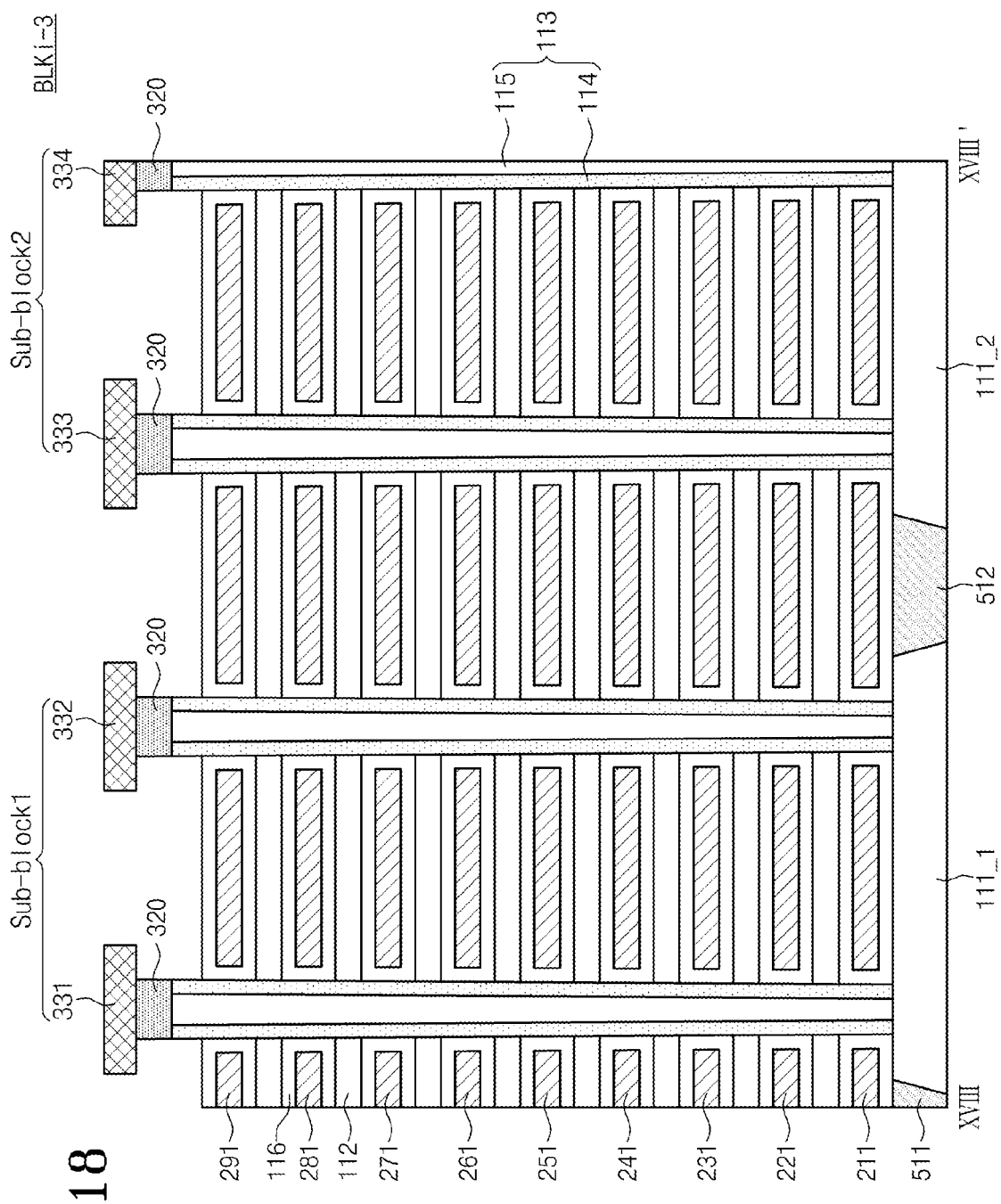
FIG. 18 is a cross-sectional view taken along a line XVIII-XVIII' of the memory block in FIG. 17.

FIG. 17 is a perspective view illustrating an example of a structure corresponding to the memory block BLKi-3 in FIG. 16, and FIG. 18 is a cross-sectional view taken along a line XVIII-XVIII' of the memory block BLKi-3 in FIG. 17. Referring to FIGS. 17 and 18, the memory block BLKi-3 includes structures extending in first to third directions.

A substrate is provided. In example embodiments, the substrate may be a well having a first type (e.g., first conductivity type). For example, the substrate may be a P-well formed by implanting a group 3 element such as boron (B). For example, the substrate may be a pocket p-well provided in an n-well. Hereinafter, let it be assumed that the substrate has a p-type well (or p-type packet well). However, the conductivity type of the substrate is not limited to the p-type.

The substrate includes a plurality of isolation regions 511 and 512. The substrate includes a plurality of well regions 111_1 and 111_2 divided by the isolation regions 511 and 512.

A plurality of doped regions 311 to 313 extending in the first direction are provided on the well regions 111_1 and 111_2. For example, the doped regions 311 to 313 may have a second type (e.g., second conductivity type) different from the well regions 111_1 and 111_2. For example, the doped regions 311 to 313 may have an n-type. Hereinafter, let it be assumed the doped regions 311 to 313 have an n-type. However, the conductivity type of the first and second doped regions 311 and 312 is not limited to the n-type.

A plurality of insulating materials 112 extending in the first direction are sequentially provided on the well regions 111_1 and 111_2. In example embodiments, the insulating materials 112 may include an insulating material such as silicon oxide. The insulating materials 112 may be provided to be spaced apart from each other at specific intervals in the second direction.

A plurality of pillars 113 penetrating the insulating materials 112 in the second direction are sequentially provided on the well regions 111_1 and 111_2 in the first direction. In example embodiments, the pillars 113 may be in contact with the well regions 111_1 and 111_2 through the insulating materials 1123.

In example embodiments, each of the pillars 113 may include a plurality of materials. For example, a surface layer 114 of each of the pillars 113 may include a silicon material having a first conductivity type. For example, the surface layer 114 of each of the pillars 113 may include a silicon material having the same conductivity type as the well regions 111_1 and 111_2. Hereinafter, let it be assumed that the surface layer 114 of each of the pillars 113 may include p-type silicon. However, a material included in the surface layer 114 of each of the pillars 113 is not limited to the p-type silicon.

An inner layer 115 of each of the pillars 113 includes an insulating material. For example, the inner layer 115 of each of the pillars 113 may include an insulating layer such as silicon oxide. For example, the inner layer 115 of each of the pillars 113 may include an air gap.

On the well regions 111_1 and 111_2, an insulating layer 116 is provided along exposed surfaces of the insulating materials 112, the pillars 113, and the well region 111_1 and 111_2.

In example embodiments, thickness of the insulating layer 116 may be smaller than half a distance between the insulating materials 112. That is, apart from the insulating materials 112 and the insulating layer 116, another material may be disposed in a space that may be provided between the insulating layer 116 provided on a bottom surface of the first insulating material and the insulating layer 116 provided on a top surface of the second insulating material.

On the well regions 111_1 and 111_2, first conductive materials 211-291, 212-292, and 213-293 are provided on an exposed surface of the insulating layer 116. For example, first conductive materials 211, 212, and 213 extending in the first direction are provided between the well regions 111_1 and 111_2 and an insulating material 112 adjacent to the well regions 111_1 and 111_2.

A plurality of first conductive materials 221-281, 222-282, and 223-283 extending in the first direction are provided between the insulating materials 112. In example embodiments, the first conductive materials 211-291, 212-292, and 213-293 are metal materials. In example embodiments, the first conductive materials 211-291, 212-292, and 213-293 may conductive materials such as polysilicon.

Drains 320 are provided on the pillars 113, respectively. In example embodiments, the drains 320 may include silicon materials doped with second-type impurities. Hereinafter, let it be assumed that the drains 320 may include n-type silicon materials. However, materials included in the drains 320 are not limited to the n-type silicon materials.

In example embodiments, width of each of the drains 320 may be greater than that of a corresponding pillar 113. For example, each of the drains 320 may be provided on a top surface of a corresponding pillar 113 in the form of a pad. In example embodiments, each of the drains 320 may extend to a portion of a surface layer 114 of a corresponding pillar 113.

Second conductive materials 331-333 extending in the third direction are provided on the drains 320. The second conductive materials 331-333 are disposed to be spaced apart from each other at specific intervals in the first direction. The second conductive materials 331-333 are connected to drains 320 in a corresponding region, respectively. In example embodiments, the drains 320 and the second conductive material 333 extending in the third direction are connected to each other through contact plugs, respectively. In example embodiments, the second conductive materials 331-333 may be metal materials. In example embodiments, the second conductive materials 331-333 may be conductive materials such as polysilicon.

Hereinafter, heights of the first conductive materials 211-291, 212-292, and 213-293 will be defined. The first conductive materials 211-291, 212-292, and 213-293 are defined to have first to ninth heights sequentially from the well regions 111_1 and 111_2. That is, the first conductive materials 211-214 adjacent to the well regions 111_1 and 111_2 have the first height. The first conductive materials 291-293 adjacent to the second conductive materials 331-333 have the ninth height. The more the order from a plurality of well regions 111_1 and 111_2 of a specific one of the first conductive materials 211-291, 212-292, and 213-293 increases, the more height of the first conductive material increases.

In FIGS. 17 and 18, each of the pillars 113 may constitute a string together with the insulating layer 116 and the conductive materials 211-291, 212-292, and 213-293. For example, each of the pillars 113 constitute a NAND string NS together with an adjacent region of the insulating layer 116 and an adjacent region among the first conductive materials 211-291, 212-292, and 213-293. The NAND string NS includes a plurality of transistor structures TS.

As explained in FIGS. 17 and 18, the first conductive materials 211-291, 212-292, and 213-293 are provided to nine layers. However, the inventive concept is not limited to the above explanation. For example, the conductive materials may be provided to eight layers constituting memory cells and at least two layers constituting select transistors. The first conductive materials may be provided to sixteen layers constituting memory cells and at least two layers constituting select transistors.

A sectional area of the pillar 113 according to the first and third directions may vary depending on a process characteristic or error. As shown in FIGS. 17 and 18, the sectional area of the pillar 113 according to the first and third directions may decrease as the pillar 113 closely approaches the well regions 111_1 and 111_2. The pillar 113 may be formed by providing materials such as a silicon material and an insulating material to a hole formed by etching. The more etched depth increases, the more an area of the hole formed by the etching according to the first and third directions may decrease.

The first sub-block Sub-block1 includes NAND strings formed on the first well region 111_1. The second sub-block Sub-block2 includes NAND strings formed on the second well region 111_2.

During an erase operation, an erase voltage is applied to a well region of a selected one of the sub-blocks Sub-block1 and Sub-block2. An unselect erase voltage Vuners is applied to a well region of an unselected one of the sub-blocks Sub-block1 and Sub-block2. Alternatively, the well region of the unselected sub-block is floated. Thus, the nonvolatile memory device 100 according to the inventive concept may independently apply a voltage to each of the well regions 111_1 and 111_2 to perform an erase operation in units of the sub-blocks.

Accordingly, the sub-blocks Sub-block1 and Sub-block2 may divide NAND strings connected to bitlines in a memory block into a plurality of groups. For example, the first sub-block Sub-block1 may include NAND strings NS11 to NS31 and NS12 to NS32 connected to first and second bitlines BL1 and BL2. The second sub-block Sub-block2 may include NAND strings NS13 to NS33 and NS14 to NS34 connected to third and fourth bitlines BL3 and BL4.

Figure 19:
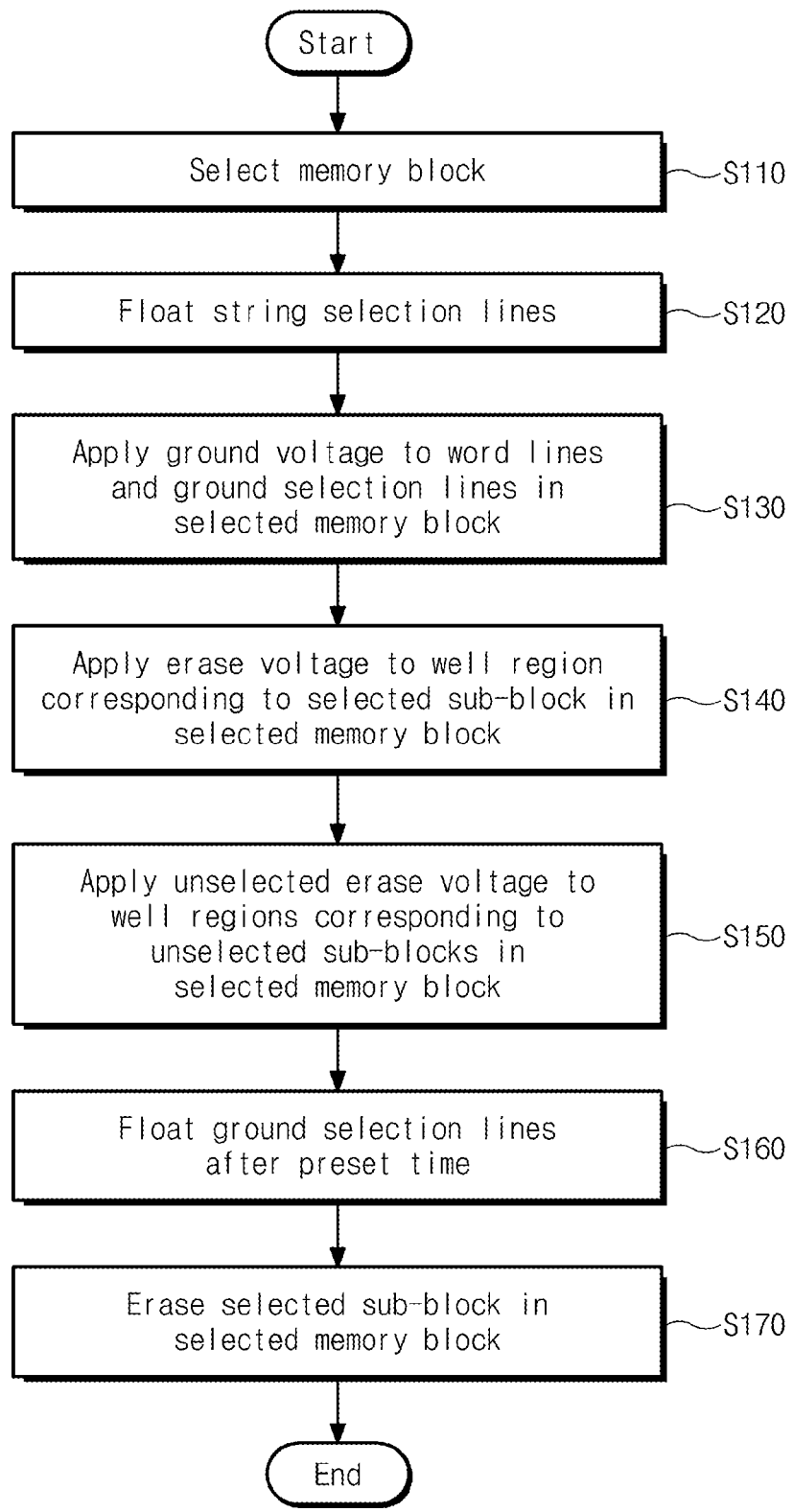
FIG. 19 is a flowchart summarizing an erasing method of the nonvolatile memory device in FIG. 1.

FIG. 19 is a flowchart summarizing an erasing method of the nonvolatile memory device in FIG. 1. Referring to FIG. 19, the nonvolatile memory device 100 (see FIG. 1) may perform an erase operation in units of sub-blocks divided into a plurality of well regions The nonvolatile memory device 100 selects a memory block including a sub-block to be erased (S110).

The nonvolatile memory device 100 floats string select lines SSL in the selected memory block (S120).

The nonvolatile memory device 100 applies a ground voltage VSS to wordlines WL and a ground select line GSL in the selected memory block (S130).

The nonvolatile memory device 100 applies an erase voltage Vers to a well region corresponding a selected sub-block in the selected memory block (S140). The selected sub-block is a sub-block to be erased.

The nonvolatile memory device 100 applies an unselect erase voltage Vuners to a well region corresponding to unselected sub-blocks in the selected memory block (S150). Alternatively, the nonvolatile memory device 100 may float the well region corresponding to the unselected sub-blocks. The unselected sub-blocks are sub-blocks to be erase-inhibited.

The nonvolatile memory device 100 floats the ground select line GSL after predetermined time elapses (S160). The ground select line GSL may be floated after predetermined time elapses from a point of time when the erase voltage is applied to the selected sub-block. Thus, the erase voltage Vers supplied to the well region corresponding to the selected sub-block may be stably supplied to a channel.

The nonvolatile memory device 100 may perform an erase operation on memory cells included in the selected sub-block (S170). Thus, the nonvolatile memory device 100 may independently apply a voltage to each of a plurality of well regions formed on a substrate or a horizontal semiconductor layer to perform an erase operation in units of sub-blocks corresponding to the well regions.

Figure 20:
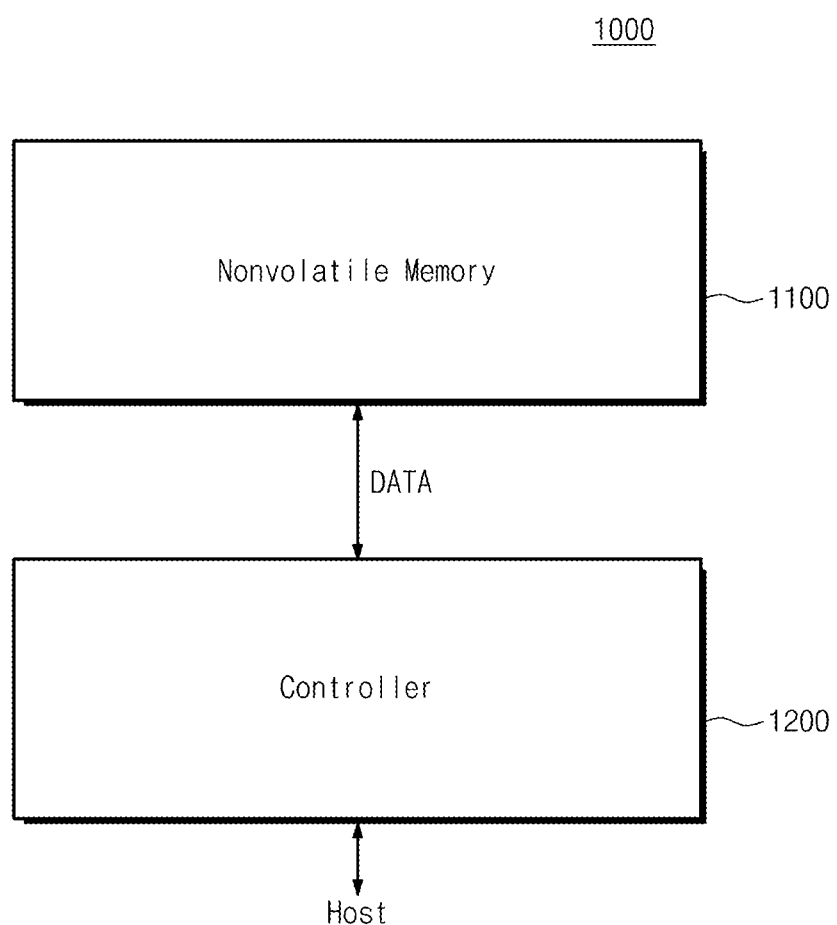
FIG. 20 is a block diagram of a memory system according to example embodiments of inventive concepts.

FIG. 20 is a block diagram of a memory system 1000 according to example embodiments of inventive concepts. As illustrated, the memory system 1000 includes a nonvolatile memory device 1100 and a controller 1200.

In example embodiments, the nonvolatile memory device 1100 may be the nonvolatile memory device 100 described with reference to FIGS. 1 to 19. As described with reference to FIGS. 1 to 19, the nonvolatile memory device 1100 may independently apply a voltage to respective well regions formed on a substrate or a horizontal semiconductor layer to perform an erase operation in units of sub-blocks corresponding to the well regions, respectively.

The controller 1200 is connected to the nonvolatile memory device 1100. The controller 1200 is configured to access the nonvolatile memory device 1100. For example, the controller 1200 is configured to control read, write, erase, and background operations of the nonvolatile memory device 1100. The controller 1200 is configured to provide interface between the nonvolatile memory device 1100 and a host. The controller 2000 is configured to drive firmware for controlling the nonvolatile memory device 1100.

In example embodiments, the controller 1200 may include elements such as a random access memory (RAM), a processing unit, a host interface, a memory interface, and an error correction unit.

The controller 1200 may communicate with external device (e.g., host) via at least one of various communications standards such as USB (Universal Serial Bus), MMC (multimedia card), PCI (peripheral component interconnection), PCI-E (PCI-express), ATA (Advanced Technology Attachment), Serial-ATA, Parallel-ATA, SCSI (small computer small interface), ESDI (enhanced small disk interface), IDE (integrated Drive Electronics), and a Firewire.

The controller 1200 and the nonvolatile memory device 1100 may be integrated into a single semiconductor device. In example embodiments, the controller 1200 and the nonvolatile memory device 1100 may be integrated into a single semiconductor device to constitute a solid state drive (SSD). The controller 1200 and the non-volatile memory device 1200 may be integrated into a single semiconductor device to constitute a memory card such as a PC card (PCMCIA, personal computer memory card international association), a compact flash card (CF), a smart media card (SM, SMC), a memory stick, a multimedia card (MMC, RS-MMC, MMC-micro), an SD card (SD, miniSD, microSD, SDHC), and a universal flash storage (UFS).

The controller 1200 and the nonvolatile memory device 1100 may be integrated into a single semiconductor device to constitute a solid state drive (SSD). The SSD includes a storage unit configured to store data in a semiconductor memory. In the case where the memory system 1000 is used as the SSD, the operating speed of the host connected with the memory system 1000 is dramatically improved.

As another example, the memory system 1000 may be provided as one of various elements constituting an electronic device such as a computer, an ultra-mobile PC (UMPC), a workstation, a net-book, a personal digital assistant (PDA), a portable computer, a web tablet, a wireless phone, a mobile phone, a smart phone, an e-book, a portable multimedia player (PMP), a portable game device, a navigation device, a black box, a digital camera, a digital multimedia broadcasting (DMB) player, a three-dimensional television, a smart television, a digital audio recorder, a digital audio player, a digital picture recorder, a digital picture player, a digital video recorder, and a digital video player, a device capable of transmitting/receiving information in wireless environment, one of various electronic devices constituting a home network, an RFID device or one of various elements constituting a computing system.

In example embodiments, the nonvolatile memory device 1100 or the memory system 1000 may be mounted in various types of packages. For example, the nonvolatile memory device 1100 or the memory system 1000 may be packaged by one of a package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline (SOIC), a shrink small outline package (SSOP), a thin small outline package (TSOP), a system in package (SIP), a multi chip package (MCP), a wafer-level fabricated package (WFP), and a wafer-level processed stack package (WSP).

Figure 21:
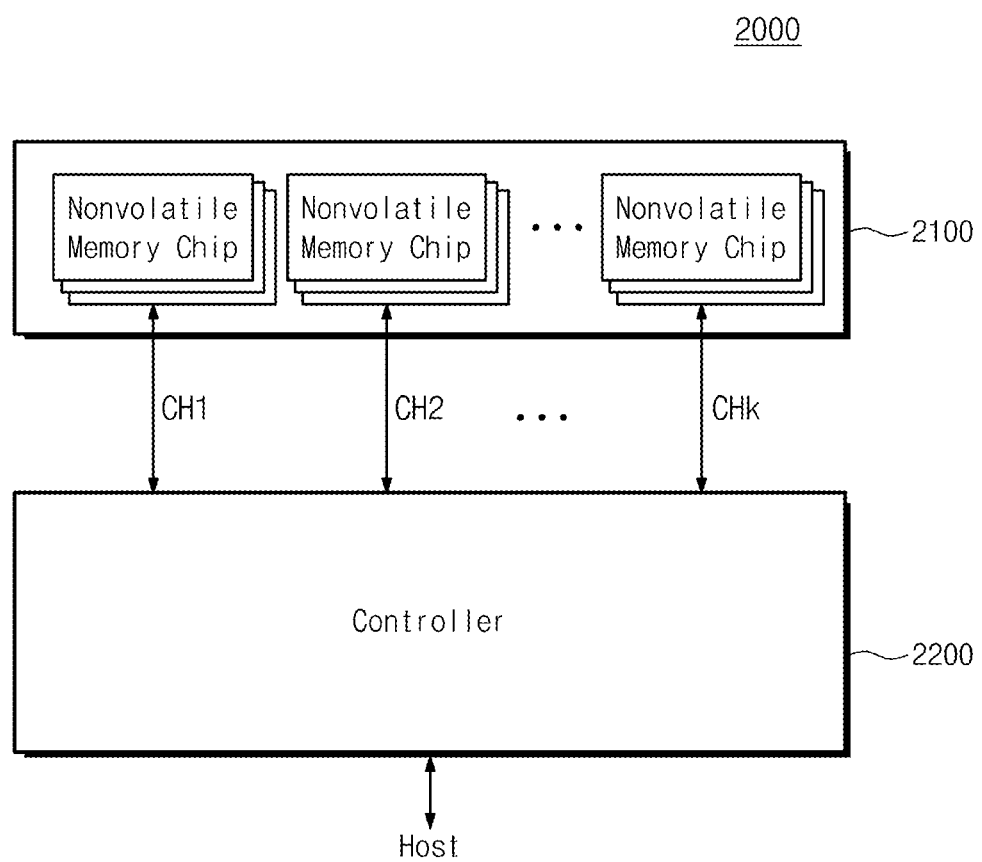
FIG. 21 is a block diagram of a memory system according to example embodiments of inventive concepts.

FIG. 21 is a block diagram of a memory system 2000 according to example embodiments of inventive concepts. As illustrated, the memory system 2000 includes a nonvolatile memory device 2100 and a controller 2200. The nonvolatile memory device 2100 includes a plurality of nonvolatile memory chips. The nonvolatile memory chips are divided into a plurality of groups. Each of the nonvolatile memory chip groups is configured to communicate with the controller 2200 through a single common channel. In example embodiments, the nonvolatile memory chips are configured to communicate with the controller 2200 through first to $k^{th}$ channels CH1 to CHk.

In example embodiments, each of the nonvolatile memory chips may be the nonvolatile memory device 100 described with reference to FIGS. 1 to 19. As described with reference to FIGS. 1 to 19, each of the nonvolatile memory chips may independently apply a voltage to respective well regions formed on a substrate or a horizontal semiconductor layer to perform an erase operation in units of sub-blocks corresponding to the well regions, respectively.

In FIG. 21, it has been explained that a plurality of nonvolatile memory chips are connected to a single channel. However, the memory system 2000 may be changed to connect a single nonvolatile memory chip to a single channel.

Figure 22:
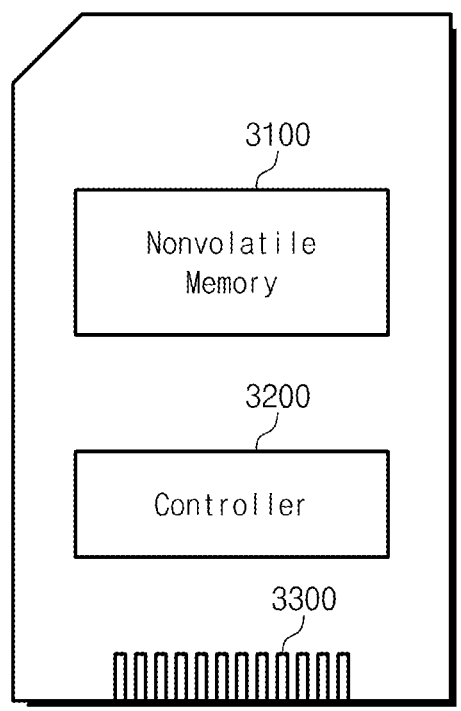
FIG. 22 illustrates a memory card according to example embodiments of inventive concepts.

FIG. 22 illustrates a memory card 3000 according to example embodiments of inventive concepts. As illustrated, the memory card 3000 includes a nonvolatile memory device 3100, a controller 3200, and a connector 3300.

The nonvolatile memory device 3100 may be the nonvolatile memory device 100 described with reference to FIGS. 1 to 19. As described with reference to FIGS. 1 to 19, the nonvolatile memory device 3100 may independently apply a voltage to respective well regions formed on a substrate or a horizontal semiconductor layer to perform an erase operation in units of sub-blocks corresponding to the well regions, respectively. The connector 3300 may electrically connect the memory card 3000 and an external device (e.g., host) to each other.

The memory card 3000 may constitute memory cards such as PC card (PCMCIA), compact flash card (CF), smart media card (SM/SMC), memory stick, multimedia card (MMC, RS-MMC, MMCmicro), SD card (SD, miniSD, microSD, SDHC), and universal flash storage device (UFS).

Figure 23:
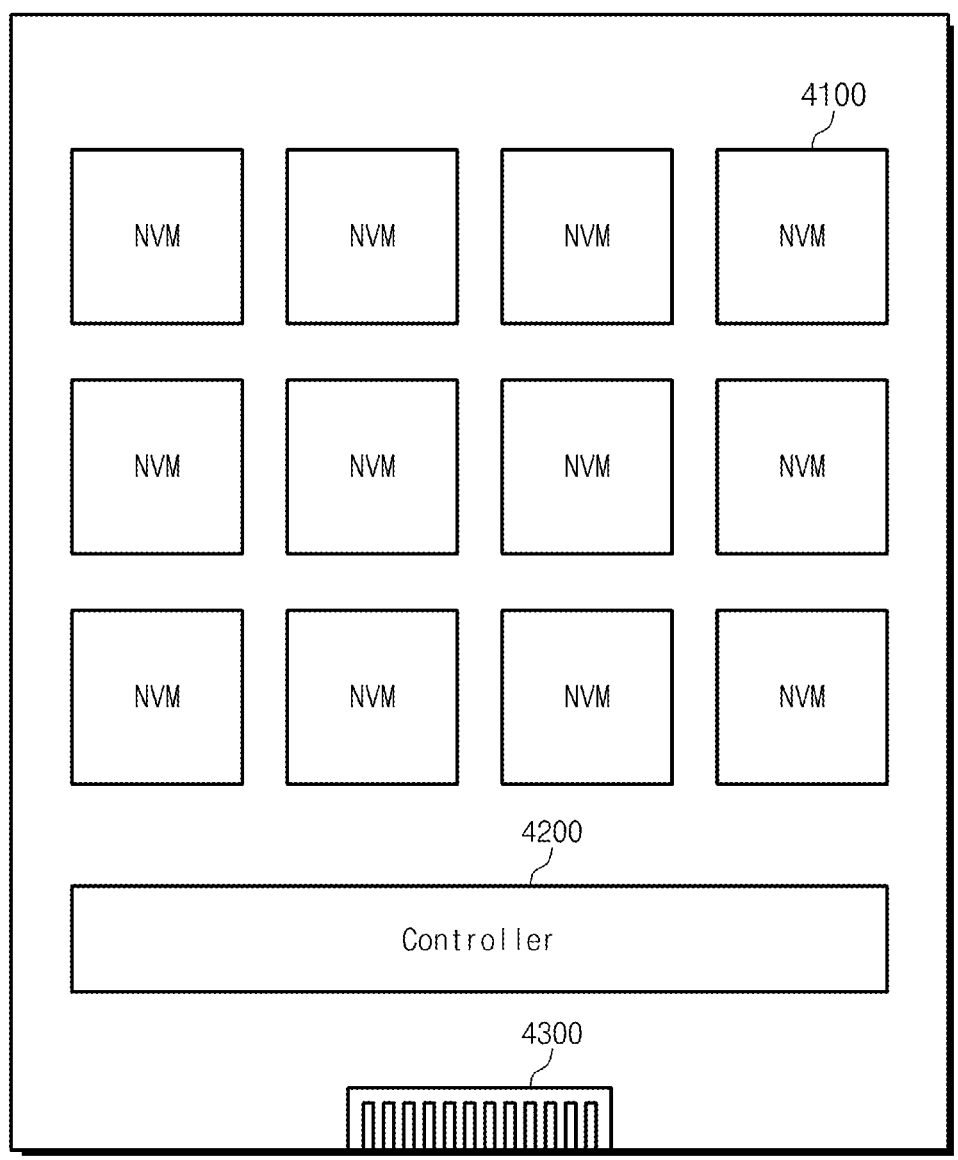
FIG. 23 illustrates a solid state drive (SSD) according to example embodiments of inventive concepts.

FIG. 23 illustrates a solid state drive (SSD) 4000. As illustrated, the SSD 4000 includes a plurality of nonvolatile memory devices 4100, a controller 4200, and a connector 4300.

The nonvolatile memory device 4100 may be the nonvolatile memory device 100 described with reference to FIGS. 1 to 19. As described with reference to FIGS. 1 to 19, the nonvolatile memory device 4100 may independently apply a voltage to respective well regions formed on a substrate or a horizontal semiconductor layer to perform an erase operation in units of sub-blocks corresponding to the well regions, respectively. The connector 4300 may electrically connect the SSD 4000 and an external device (e.g., host) to each other.

Figure 24:
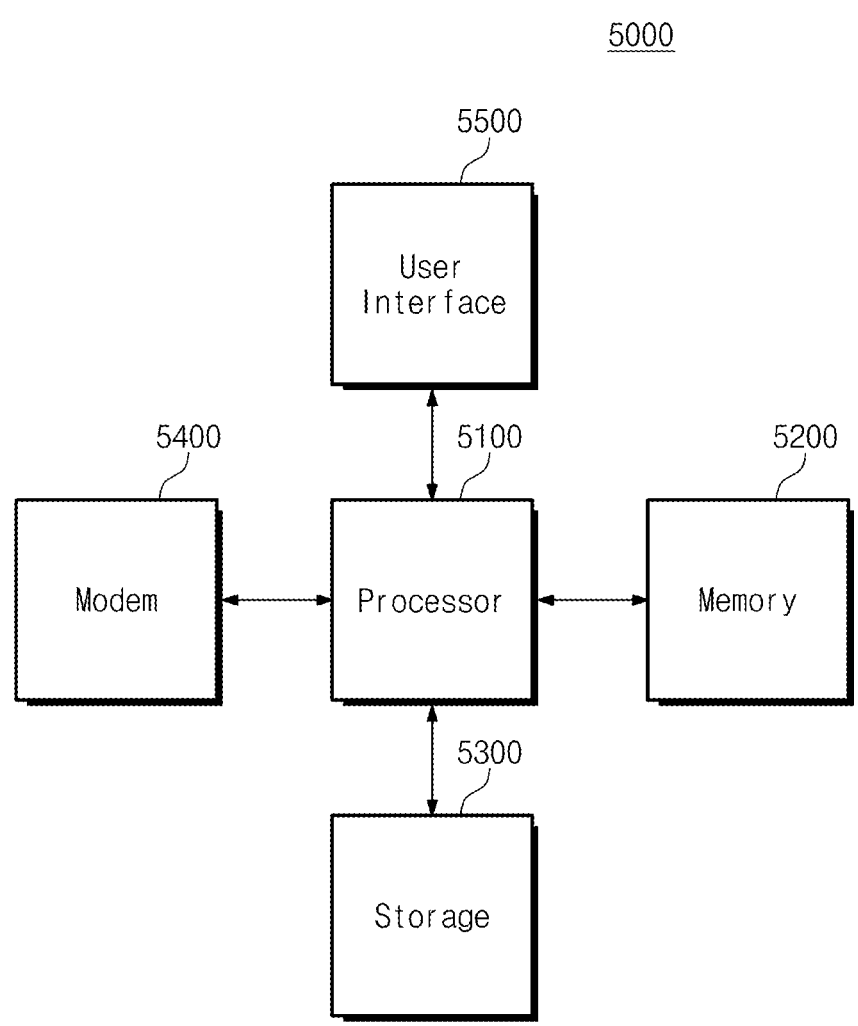
FIG. 24 is a block diagram of a computing device according to example embodiments of inventive concepts.

FIG. 24 is a block diagram of a computing device 5000 according to example embodiments of inventive concepts. As illustrated, the computing device 5000 includes a processor 5100, a memory 5200, a storage 5300, a modem 5400, and a user interface 5500.

The processor 5100 may control the overall operation of the computing device 5000 and perform a logic operation. For example, the processor 5100 may include a system-on-chip (SoC). The processor 5100 may be a universal processor or an application processor.

The memory 5200 may communicate with the processor 5100. The memory 5200 may be a working memory (or main memory) of the processor 5100 or the computing device 5000. The memory 5200 may include a volatile memory such as stack RAM (SRAM), dynamic RAM (DRAM), and synchronous DRAM (SDRAM) or a nonvolatile memory such as phase-change RAM (PRAM), magnetic RAM (MRAM), resistive RAM (RRAM), and ferroelectric RAM (FRAM).

The storage 5300 may store data that the computing device 5000 desires to stores for a long period. The storage 5300 may include a hard disk drive (HDD) or a nonvolatile memory device such as flash memory, phase-change RAM (PRAM), magnetic RAM (MRAM), resistive RAM (RRAM), and ferroelectric RAM (FRAM).

The storage 5300 may be the nonvolatile memory device 100 described with reference to FIGS. 1 to 19. As described with reference to FIGS. 1 to 19, the storage 5300 may independently apply a voltage to respective well regions formed on a substrate or a horizontal semiconductor layer to perform an erase operation in units of sub-blocks corresponding to the well regions, respectively.

In example embodiments, the memory 5200 and the storage 5300 may include the same type of a nonvolatile memory device. In this case, the memory 5200 and the storage 5300 may include a single semiconductor integrated circuit.

The modem 140 may be configured to communicate with an external device according to the control of the processor 5100. For example, the modem 140 may perform wired or wireless communications with an external device. The modem 140 may perform communications based on at least one of wireless communication techniques or protocols such as LTE (Long Term Evolution), WiMax, GSM (Global System for Mobile communication), CDMA (Code Division Multiple Access), Bluetooth, NFC (Near Field Communication), WiFi, and RFID (Radio Frequency Identification) or wired communication techniques or protocols such as USB (Universal Serial Bus), SATA (Serial AT Attachment), SCSI (Small Computer Small Interface), Firewire, and PCI (Peripheral Component Interconnection).

The user interface 5500 may communicate with a user according to the control of the processor 5100. For example, the user interface device 5500 may include user input interfaces such as a keyboard, a keypad, a button, a touch panel, a touch screen, a touch ball, a touch pad, a camera, a gyroscope sensor, and a vibration sensor. The user interface device 5500 may include user output interfaces such as an liquid crystal display (LCD), an organic light emitting diode (OLED) display, an active matrix OLED (AMOLED) display, an LED, a speaker, and a motor.

While some example embodiments have been particularly shown and described, it will be understood by one of ordinary skill in the art that variations in form and detail may be made therein without departing from the spirit and scope of the claims.

What is claimed is:

1. A nonvolatile memory device comprising:
   a substrate;
   a peripheral logic structure on the substrate;
   a lower filling insulating layer covering the peripheral logic structure;
   a horizontal semiconductor layer on the lower filling insulating layer, the horizontal semiconductor layer including a plurality of doped regions spaced apart from each other in a first direction and a plurality of well regions between the doped regions; and
   a three-dimensional memory cell array on the horizontal semiconductor layer, the three-dimensional memory cell array including a plurality of memory blocks,
   each of the memory blocks including sub-blocks on corresponding ones of the well regions, and
   the nonvolatile memory device is configured to perform an erase operation in units of the sub-blocks by independently applying an erase voltage to a selected one of the well regions during the erase operation, wherein
   the nonvolatile memory device is configured to apply an unselect voltage to an unselected one of the well regions or float the unselected one of the well regions during the erase operation, and
   a value of the erase voltage is different than a value of the unselect voltage.

2. The nonvolatile memory device as set forth in claim 1, wherein
   the three-dimensional memory cell array includes a plurality of cell strings, and
   each of the cell strings includes a plurality of memory cells stacked on each other in a direction perpendicular to the horizontal semiconductor layer, a ground select transistor between the memory cells and the horizontal semiconductor layer, and a string select transistor between the memory cells and a bitline.

3. The nonvolatile memory device as set forth in claim 1, wherein
   the doped regions extend in a direction perpendicular to the three-dimensional memory cell array, and
   the doped regions are connected to the lower filling insulating layer.

4. The nonvolatile memory device as set forth in claim 1, wherein
   the well regions include a first well region,
   the first well region is the selected one of the well regions during the erase operation,
   the first well region corresponds to a selected sub-block among the sub-blocks during the erase operation, and
   the nonvolatile memory device is configured to apply the erase voltage to the first well region during the erase operation.

5. The nonvolatile memory device as set forth in claim 4, wherein
   the well region includes a second well region,
   the second well region is an unselected one of the well regions during the erase operation,
   the second well region corresponds to an unselected sub-block among the sub-blocks during the erase operation.

6. The nonvolatile memory device as set forth in claim 5, further comprising:
   wordlines connected to the memory blocks, wherein the nonvolatile memory device is configured to supply a voltage during the erase operation to the wordlines that are connected to a selected one of the memory blocks, and the unselect voltage is higher than the voltage supplied to the wordlines connected to the selected one of the memory blocks during the erase operation.

7. The nonvolatile memory device as set forth in claim 1, wherein the doped regions are a common source line.

8. The nonvolatile memory device as set forth in claim 1, further comprising:
bitlines connected to the three-dimensional memory cell array, wherein
the first direction is parallel the bitlines.

9. The nonvolatile memory device as set forth in claim 1, further comprising:
bitlines connected to the three-dimensional memory cell array, wherein
the first direction is perpendicular to the bitlines.

10. The nonvolatile memory device as set forth in claim 1, further comprising:
conductive interconnections in the lower filling insulating layer, wherein
the conductive interconnections are connected to the well regions and configured to receive the erase voltage or an unselect erase voltage during the erase operation.

11. A nonvolatile memory device comprising:
a substrate;
a plurality of isolation insulating layers extending a first direction in the substrate;
a plurality of well regions in the substrate, the well regions separated by the isolation insulating layers; and
a three-dimensional memory cell array including a plurality of memory blocks on the substrate,
each of the memory blocks including sub-blocks on corresponding ones of the well regions, and
the nonvolatile memory device is configured to perform an erase operation in units of the sub-blocks by independently applying an erase voltage to a selected one of the well regions during the erase operation, wherein
the nonvolatile memory device is configured to apply an unselect voltage to an unselected one of the well regions or float the unselected one of the well regions during the erase operation, and
a value of the erase voltage is different than a value of the unselect voltage.

12. The nonvolatile memory device as set forth in claim 11, wherein
the well regions include a first well region,
the first well region is the selected one of the well regions during the erase operation, the first well region corresponds to a selected sub-block among the sub-blocks during the erase operation, and
the nonvolatile memory device is configured to apply the erase voltage to the first well region during the erase operation.

13. The nonvolatile memory device as set forth in claim 12, wherein
the well regions include a second well region,
the second well region is an unselected one of the well regions during the erase operation,
the second well region corresponds to an unselected sub-block among the sub-blocks during the erase operation, and
the nonvolatile memory device is configured to apply the unselect voltage to the second well region or float the second well region during the erase operation.

14. The nonvolatile memory device as set forth in claim 11, wherein
the nonvolatile memory device is configured to supply a voltage during the erase operation to wordlines that are connected to a selected one of the memory blocks, and
the unselect voltage is higher than the voltage supplied to the wordlines connected to the selected one of the memory blocks during the erase operation.

15. A nonvolatile memory device comprising:
a memory cell array including,
a plurality of memory blocks on a support structure,
the support structure including a plurality of well regions separated in a first direction by one of doped regions and isolation insulating layers,
each of the memory blocks including sub-blocks on corresponding ones of the well regions; and
a controller configured to control an erase operation performed on the memory cell array in units of the sub-blocks, the controller configured to independently apply an erase voltage to a selected one of the well regions during the erase operation, wherein
the controller is configured to apply an unselect voltage to an unselected one of the well regions or float the unselected one of the well regions during the erase operation, and
a value of the erase voltage is different than a value of the unselect voltage.

16. The nonvolatile memory device of claim 15, wherein
the support structure includes a substrate, a peripheral logic structure on the substrate, a lower filling insulating layer covering the peripheral logic structure, and a horizontal semiconductor layer on the lower filling insulating layer,
the one of doped regions and isolation insulation layers is the doped regions,
the horizontal semiconductor layer includes the well regions separated in the first direction by the doped regions, and
a conductivity type of the doped regions is opposite a conductivity type of the well regions.

17. The nonvolatile memory device of claim 15, wherein
the support structure includes a substrate,
the one of doped regions and isolation insulating layers is the isolation insulating layers,
the isolation insulating layers extend in a second direction in the substrate,
the second direction is perpendicular to the first direction, and
the plurality of well regions are in the substrate and separated in the first direction by the isolation insulating layers.

18. The nonvolatile memory device of claim 15, wherein
each of the memory blocks includes a plurality of cell strings on the plurality of well regions of the support structure, respectively, and
each of the cell strings includes a plurality of memory cells stacked vertically on each other between a ground select transistor and a string select transistor.

19. The nonvolatile memory device of claim 15, wherein
the controller is configured to apply an unselect voltage or a ground voltage to unselected well regions during the erase operation,
the controller is configured to float string select lines and ground select lines connected to the plurality of memory blocks during the erase operation, the controller is configured to apply a voltage to word lines that are connected to a selected memory block among the plurality of memory blocks during the erase operation, the controller is configured to apply a voltage that floats word lines that are connected to an unselected memory block among the plurality of memory blocks during the erase operation, and the unselect voltage is higher than the voltage applied to the word lines that are connected to the selected memory block and less than the voltage that floats the word lines that are connected to the unselected memory block during the erase operation.

20. The nonvolatile memory device of claim 15, wherein the controller is configured to apply the unselect voltage to unselected ones of the well regions during the erase operation, the controller is configured to apply a ground voltage to wordlines connected to a selected memory block among the plurality of memory blocks and float wordlines connected to an unselected memory block among the plurality of memory blocks during the erase operation, the unselect voltage is between the ground voltage and the erase voltage, and a voltage to float the wordlines connected to the unselected memory block is between the unselect voltage and the erase voltage.

* * * * *